United States Patent
Bai et al.

(10) Patent No.: US 12,149,464 B2
(45) Date of Patent: Nov. 19, 2024

(54) PHASE TRACKING REFERENCE SIGNAL DESIGN FOR SINGLE-CARRIER WAVEFORM WITH MULTIPLE DATA LAYERS

(71) Applicant: QUALCOMM Incorporated, San Diego, CA (US)

(72) Inventors: Tianyang Bai, Somerville, NJ (US); Wooseok Nam, San Diego, CA (US); Tao Luo, San Diego, CA (US); Junyi Li, Fairless Hills, PA (US)

(73) Assignee: QUALCOMM Incorporated, San Diego, CA (US)

( * ) Notice: Subject to any disclaimer, the term of this patent is extended or adjusted under 35 U.S.C. 154(b) by 215 days.

(21) Appl. No.: 17/305,426

(22) Filed: Jul. 7, 2021

(65) Prior Publication Data

US 2022/0021497 A1    Jan. 20, 2022

Related U.S. Application Data

(60) Provisional application No. 62/705,852, filed on Jul. 17, 2020.

(51) Int. Cl.
*H04L 5/00* (2006.01)
*H04L 27/26* (2006.01)
*H03F 3/24* (2006.01)

(52) U.S. Cl.
CPC ........ *H04L 5/0048* (2013.01); *H04L 27/2605* (2013.01); *H03F 3/24* (2013.01)

(58) Field of Classification Search
CPC . H04L 5/0048; H04L 27/2605; H04L 5/0005; H04L 5/0051; H03F 3/24
See application file for complete search history.

(56) References Cited

U.S. PATENT DOCUMENTS

| | | | |
|---|---|---|---|
| 2019/0182001 A1 | 6/2019 | Lee et al. | |
| 2019/0306809 A1 | 10/2019 | Qi | |
| 2020/0076647 A1 | 3/2020 | Zhang et al. | |
| 2020/0220755 A1* | 7/2020 | Maki ................... | H04L 27/2675 |
| 2021/0044372 A1 | 2/2021 | Yang et al. | |

FOREIGN PATENT DOCUMENTS

WO    2019194577 A1    10/2019

OTHER PUBLICATIONS

International Search Report and Written Opinion—PCT/US2021/070844—ISA/EPO—Oct. 14, 2021.

* cited by examiner

*Primary Examiner* — Justin T Van Roie
(74) *Attorney, Agent, or Firm* — QUALCOMM Incorporated

(57) ABSTRACT

Various aspects of the present disclosure generally relate to wireless communication. In some aspects, a user equipment (UE) may transmit, to a base station, information indicating at least one of a power amplifier sharing configuration or a phase noise sharing configuration for a plurality of layers of a single-carrier communication. The UE may receive, from the base station, a phase tracking reference signal (PTRS) configuration for the plurality of layers based at least in part on at least one of the power amplifier sharing configuration or the phase noise sharing configuration. The UE may perform the single-carrier communication in accordance with the PTRS configuration.

30 Claims, 11 Drawing Sheets

PHASE TRACKING REFERENCE SIGNAL DESIGN FOR SINGLE-CARRIER WAVEFORM WITH MULTIPLE DATA LAYERS

CROSS-REFERENCE TO RELATED APPLICATION

This Patent Application claims priority to U.S. Provisional Patent Application No. 62/705,852, filed on Jul. 17, 2020, entitled "PHASE TRACKING REFERENCE SIGNAL DESIGN FOR SINGLE-CARRIER WAVEFORM WITH MULTIPLE DATA LAYERS," and assigned to the assignee hereof. The disclosure of the prior Application is considered part of and is incorporated by reference into this Patent Application.

FIELD OF THE DISCLOSURE

Aspects of the present disclosure generally relate to wireless communication and to techniques and apparatuses for phase tracking reference signal (PTRS) design for a single-carrier waveform with multiple data layers.

BACKGROUND

Wireless communication systems are widely deployed to provide various telecommunication services such as telephony, video, data, messaging, and broadcasts. Typical wireless communication systems may employ multiple-access technologies capable of supporting communication with multiple users by sharing available system resources (e.g., bandwidth, transmit power, or the like). Examples of such multiple-access technologies include code division multiple access (CDMA) systems, time division multiple access (TDMA) systems, frequency-division multiple access (FDMA) systems, orthogonal frequency-division multiple access (OFDMA) systems, single-carrier frequency-division multiple access (SC-FDMA) systems, time division synchronous code division multiple access (TD-SCDMA) systems, and Long Term Evolution (LTE). LTE/LTE-Advanced is a set of enhancements to the Universal Mobile Telecommunications System (UMTS) mobile standard promulgated by the Third Generation Partnership Project (3GPP).

A wireless network may include a number of base stations (BSs) that can support communication for a number of user equipment (UEs). A UE may communicate with a BS via the downlink and uplink. "Downlink" (or "forward link") refers to the communication link from the BS to the UE, and "uplink" (or "reverse link") refers to the communication link from the UE to the BS. As will be described in more detail herein, a BS may be referred to as a Node B, a gNB, an access point (AP), a radio head, a transmit receive point (TRP), a New Radio (NR) BS, a 5G Node B, or the like.

The above multiple access technologies have been adopted in various telecommunication standards to provide a common protocol that enables different user equipment to communicate on a municipal, national, regional, and even global level. NR, which may also be referred to as 5G, is a set of enhancements to the LTE mobile standard promulgated by the 3GPP. NR is designed to better support mobile broadband Internet access by improving spectral efficiency, lowering costs, improving services, making use of new spectrum, and better integrating with other open standards using orthogonal frequency division multiplexing (OFDM) with a cyclic prefix (CP) (CP-OFDM) on the downlink (DL), using CP-OFDM and/or SC-FDM (e.g., also known as discrete Fourier transform spread OFDM (DFT-s-OFDM)) on the uplink (UL), as well as supporting beamforming, multiple-input multiple-output (MIMO) antenna technology, and carrier aggregation. As the demand for mobile broadband access continues to increase, further improvements in LTE, NR, and other radio access technologies remain useful.

SUMMARY

In some aspects, a method of wireless communication performed by a UE includes: transmitting, to a base station, information indicating at least one of a power amplifier sharing configuration or a phase noise sharing configuration for a plurality of layers of a single-carrier communication; receiving, from the base station, a phase tracking reference signal (PTRS) configuration for the plurality of layers based at least in part on at least one of the power amplifier sharing configuration or the phase noise sharing configuration; and performing the single-carrier communication in accordance with the PTRS configuration.

In some aspects, a method of wireless communication performed by a base station includes: receiving, from a UE, information indicating at least one of a power amplifier sharing configuration or a phase noise sharing configuration for a plurality of layers of a single-carrier communication; transmitting, to the UE, a PTRS configuration for the plurality of layers based at least in part on at least one of the power amplifier sharing configuration or the phase noise sharing configuration; and performing the single-carrier communication in accordance with the PTRS configuration.

In some aspects, a UE for wireless communication includes: a memory, and one or more processors coupled to the memory, the memory and the one or more processors configured to: transmit, to a base station, information indicating at least one of a power amplifier sharing configuration or a phase noise sharing configuration for a plurality of layers of a single-carrier communication; receive, from the base station, a PTRS configuration for the plurality of layers based at least in part on at least one of the power amplifier sharing configuration or the phase noise sharing configuration; and perform the single-carrier communication in accordance with the PTRS configuration.

In some aspects, a base station for wireless communication includes: a memory, and one or more processors coupled to the memory, the memory and the one or more processors configured to: receive, from a UE, information indicating at least one of a power amplifier sharing configuration or a phase noise sharing configuration for a plurality of layers of a single-carrier communication; transmit, to the UE, a PTRS configuration for the plurality of layers based at least in part on at least one of the power amplifier sharing configuration or the phase noise sharing configuration; and perform the single-carrier communication in accordance with the PTRS configuration.

In some aspects, a non-transitory computer-readable medium storing one or more instructions for wireless communication includes: one or more instructions that, when executed by one or more processors of a UE, cause the one or more processors to: transmit, to a base station, information indicating at least one of a power amplifier sharing configuration or a phase noise sharing configuration for a plurality of layers of a single-carrier communication; receive, from the base station, a PTRS configuration for the plurality of layers based at least in part on at least one of the power amplifier sharing configuration or the phase noise sharing configuration; and perform the single-carrier communication in accordance with the PTRS configuration.

In some aspects, a non-transitory computer-readable medium storing one or more instructions for wireless communication includes: one or more instructions that, when executed by one or more processors of a base station, cause the one or more processors to: receive, from a UE, information indicating at least one of a power amplifier sharing configuration or a phase noise sharing configuration for a plurality of layers of a single-carrier communication; transmit, to the UE, a PTRS configuration for the plurality of layers based at least in part on at least one of the power amplifier sharing configuration or the phase noise sharing configuration; and perform the single-carrier communication in accordance with the PTRS configuration.

In some aspects, an apparatus for wireless communication includes: means for transmitting, to a base station, information indicating at least one of a power amplifier sharing configuration or a phase noise sharing configuration for a plurality of layers of a single-carrier communication; means for receiving, from the base station, a PTRS configuration for the plurality of layers based at least in part on at least one of the power amplifier sharing configuration or the phase noise sharing configuration; and means for performing the single-carrier communication in accordance with the PTRS configuration.

In some aspects, an apparatus for wireless communication includes: means for receiving, from a UE, information indicating at least one of a power amplifier sharing configuration or a phase noise sharing configuration for a plurality of layers of a single-carrier communication; means for transmitting, to the UE, a PTRS configuration for the plurality of layers based at least in part on at least one of the power amplifier sharing configuration or the phase noise sharing configuration; and means for performing the single-carrier communication in accordance with the PTRS configuration.

Aspects generally include a method, apparatus, system, computer program product, non-transitory computer-readable medium, user equipment, base station, wireless communication device, and/or processing system as substantially described herein with reference to and as illustrated by the drawings and specification.

The foregoing has outlined rather broadly the features and technical advantages of examples according to the disclosure in order that the detailed description that follows may be better understood. Additional features and advantages will be described hereinafter. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed herein, both their organization and method of operation, together with associated advantages will be better understood from the following description when considered in connection with the accompanying figures. Each of the figures is provided for the purposes of illustration and description, and not as a definition of the limits of the claims.

While aspects are described in the present disclosure by illustration to some examples, those skilled in the art will understand that such aspects may be implemented in many different arrangements and scenarios. Techniques described herein may be implemented using different platform types, devices, systems, shapes, sizes, and/or packaging arrangements. For example, some aspects may be implemented via integrated chip embodiments or other non-module-component based devices (e.g., end-user devices, vehicles, communication devices, computing devices, industrial equipment, retail/purchasing devices, medical devices, or artificial intelligence-enabled devices). Aspects may be implemented in chip-level components, modular components, non-modular components, non-chip-level components, device-level components, or system-level components. Devices incorporating described aspects and features may include additional components and features for implementation and practice of claimed and described aspects. For example, transmission and reception of wireless signals may include a number of components for analog and digital purposes (e.g., hardware components including antennas, RF chains, power amplifiers, modulators, buffers, processor(s), interleavers, adders, or summers). It is intended that aspects described herein may be practiced in a wide variety of devices, components, systems, distributed arrangements, or end-user devices of varying size, shape, and constitution.

BRIEF DESCRIPTION OF THE DRAWINGS

So that the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects. The same reference numbers in different drawings may identify the same or similar elements.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein, one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

Several aspects of telecommunication systems will now be presented with reference to various apparatuses and techniques. These apparatuses and techniques will be described in the following detailed description and illustrated in the accompanying drawings by various blocks, modules, components, circuits, steps, processes, algorithms, or the like (collectively referred to as "elements"). These elements may be implemented using hardware, software, or combinations thereof. Whether such elements are implemented as hardware or software depends upon the particular application and design constraints imposed on the overall system.

It should be noted that while aspects may be described herein using terminology commonly associated with a 5G or NR radio access technology (RAT), aspects of the present disclosure can be applied to other RATs, such as a 3G RAT, a 4G RAT, and/or a RAT subsequent to 5G (e.g., 6G).

Figure 1:
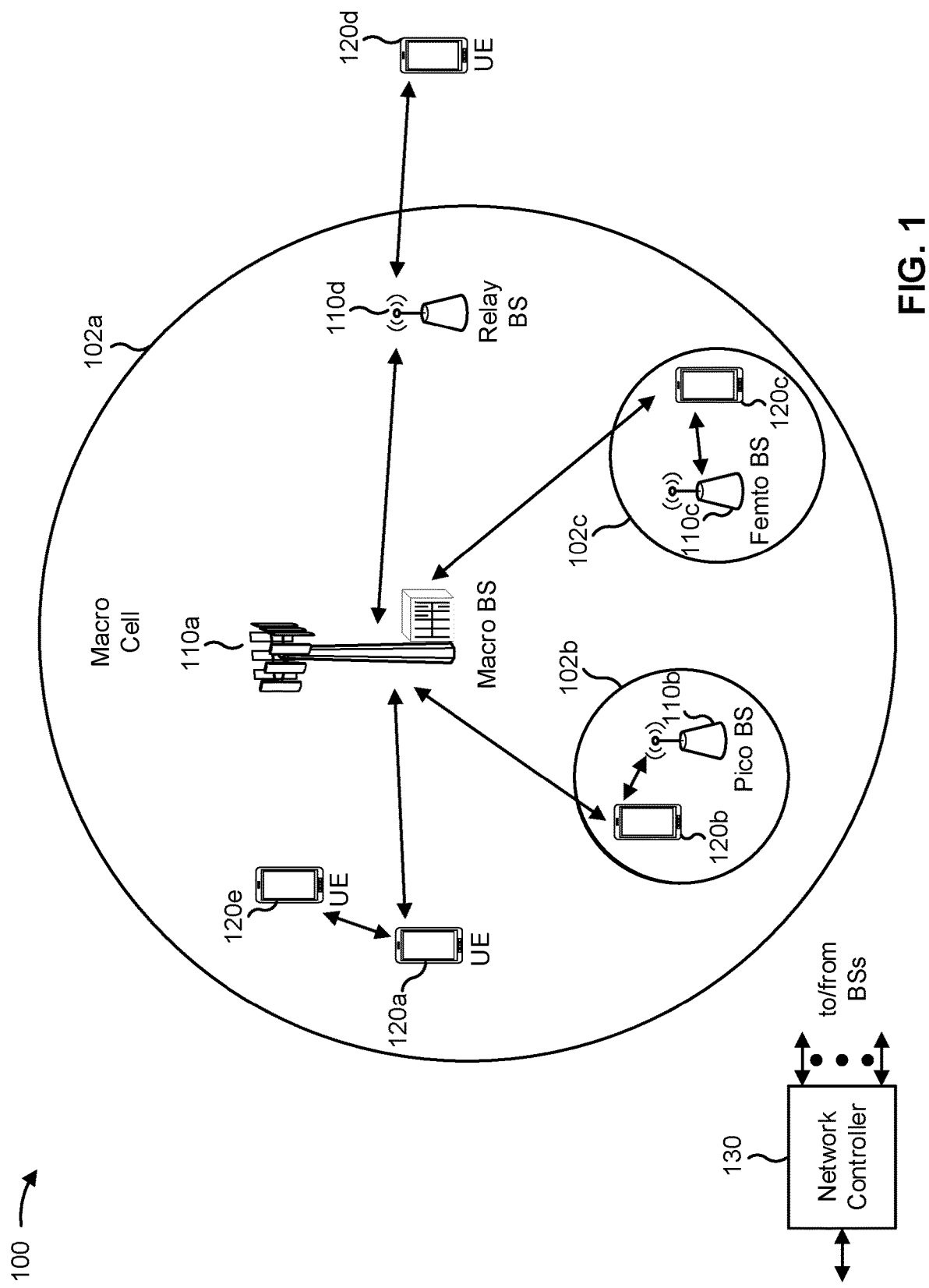
FIG. 1 is a diagram illustrating an example of a wireless network, in accordance with the present disclosure.

FIG. 1 is a diagram illustrating an example of a wireless network 100, in accordance with the present disclosure. The wireless network 100 may be or may include elements of a 5G (NR) network and/or an LTE network, among other examples. The wireless network 100 may include a number of base stations 110 (shown as BS 110a, BS 110b, BS 110c, and BS 110d) and other network entities. A base station (BS) is an entity that communicates with user equipment (UEs) and may also be referred to as an NR BS, a Node B, a gNB, a 5G node B (NB), an access point, a transmit receive point (TRP), or the like. Each BS may provide communication coverage for a particular geographic area. In 3GPP, the term "cell" can refer to a coverage area of a BS and/or a BS subsystem serving this coverage area, depending on the context in which the term is used.

A BS may provide communication coverage for a macro cell, a pico cell, a femto cell, and/or another type of cell. A macro cell may cover a relatively large geographic area (e.g., several kilometers in radius) and may allow unrestricted access by UEs with service subscription. A pico cell may cover a relatively small geographic area and may allow unrestricted access by UEs with service subscription. A femto cell may cover a relatively small geographic area (e.g., a home) and may allow restricted access by UEs having association with the femto cell (e.g., UEs in a closed subscriber group (CSG)). A BS for a macro cell may be referred to as a macro BS. A BS for a pico cell may be referred to as a pico BS. A BS for a femto cell may be referred to as a femto BS or a home BS. In the example shown in FIG. 1, a BS 110a may be a macro BS for a macro cell 102a, a BS 110b may be a pico BS for a pico cell 102b, and a BS 110c may be a femto BS for a femto cell 102c. A BS may support one or multiple (e.g., three) cells. The terms "eNB", "base station", "NR BS", "gNB", "TRP", "AP", "node B", "5G NB", and "cell" may be used interchangeably herein.

In some aspects, a cell may not necessarily be stationary, and the geographic area of the cell may move according to the location of a mobile BS. In some aspects, the BSs may be interconnected to one another and/or to one or more other BSs or network nodes (not shown) in the wireless network 100 through various types of backhaul interfaces, such as a direct physical connection or a virtual network, using any suitable transport network.

Wireless network 100 may also include relay stations. A relay station is an entity that can receive a transmission of data from an upstream station (e.g., a BS or a UE) and send a transmission of the data to a downstream station (e.g., a UE or a BS). A relay station may also be a UE that can relay transmissions for other UEs. In the example shown in FIG. 1, a relay BS 110d may communicate with macro BS 110a and a UE 120d in order to facilitate communication between BS 110a and UE 120d. A relay BS may also be referred to as a relay station, a relay base station, a relay, or the like.

Wireless network 100 may be a heterogeneous network that includes BSs of different types, such as macro BSs, pico BSs, femto BSs, relay BSs, or the like. These different types of BSs may have different transmit power levels, different coverage areas, and different impacts on interference in wireless network 100. For example, macro BSs may have a high transmit power level (e.g., 5 to 40 watts) whereas pico BSs, femto BSs, and relay BSs may have lower transmit power levels (e.g., 0.1 to 2 watts).

A network controller 130 may couple to a set of BSs and may provide coordination and control for these BSs. Network controller 130 may communicate with the BSs via a backhaul. The BSs may also communicate with one another, directly or indirectly, via a wireless or wireline backhaul.

UEs 120 (e.g., 120a, 120b, 120c) may be dispersed throughout wireless network 100, and each UE may be stationary or mobile. A UE may also be referred to as an access terminal, a terminal, a mobile station, a subscriber unit, a station, or the like. A UE may be a cellular phone (e.g., a smart phone), a personal digital assistant (PDA), a wireless modem, a wireless communication device, a handheld device, a laptop computer, a cordless phone, a wireless local loop (WLL) station, a tablet, a camera, a gaming device, a netbook, a smartbook, an ultrabook, a medical device or equipment, biometric sensors/devices, wearable devices (smart watches, smart clothing, smart glasses, smart wrist bands, smart jewelry (e.g., smart ring, smart bracelet)), an entertainment device (e.g., a music or video device, or a satellite radio), a vehicular component or sensor, smart meters/sensors, industrial manufacturing equipment, a global positioning system device, or any other suitable device that is configured to communicate via a wireless or wired medium.

Some UEs may be considered machine-type communication (MTC) or evolved or enhanced machine-type communication (eMTC) UEs. MTC and eMTC UEs include, for example, robots, drones, remote devices, sensors, meters, monitors, and/or location tags, that may communicate with a base station, another device (e.g., remote device), or some other entity. A wireless node may provide, for example, connectivity for or to a network (e.g., a wide area network such as Internet or a cellular network) via a wired or wireless communication link. Some UEs may be considered Internet-of-Things (IoT) devices, and/or may be implemented as NB-IoT (narrowband internet of things) devices. Some UEs may be considered a Customer Premises Equipment (CPE). UE 120 may be included inside a housing that houses components of UE 120, such as processor components and/or memory components. In some aspects, the processor components and the memory components may be coupled together. For example, the processor components (e.g., one or more processors) and the memory components (e.g., a memory) may be operatively coupled, communicatively coupled, electronically coupled, and/or electrically coupled.

In general, any number of wireless networks may be deployed in a given geographic area. Each wireless network may support a particular RAT and may operate on one or more frequencies. A RAT may also be referred to as a radio technology, an air interface, or the like. A frequency may also be referred to as a carrier, a frequency channel, or the like. Each frequency may support a single RAT in a given geographic area in order to avoid interference between wireless networks of different RATs. In some cases, NR or 5G RAT networks may be deployed.

In some aspects, two or more UEs 120 (e.g., shown as UE 120a and UE 120e) may communicate directly using one or more sidelink channels (e.g., without using a base station 110 as an intermediary to communicate with one another). For example, the UEs 120 may communicate using peer-to-peer (P2P) communications, device-to-device (D2D) communications, a vehicle-to-everything (V2X) protocol (e.g., which may include a vehicle-to-vehicle (V2V) protocol or a vehicle-to-infrastructure (V2I) protocol), and/or a mesh network. In this case, the UE 120 may perform scheduling operations, resource selection operations, and/or other operations described elsewhere herein as being performed by the base station 110.

Devices of wireless network 100 may communicate using the electromagnetic spectrum, which may be subdivided based on frequency or wavelength into various classes, bands, channels, or the like. For example, devices of wireless network 100 may communicate using an operating band having a first frequency range (FR1), which may span from 410 MHz to 7.125 GHz, and/or may communicate using an operating band having a second frequency range (FR2), which may span from 24.25 GHz to 52.6 GHz. The frequencies between FR1 and FR2 are sometimes referred to as mid-band frequencies. Although a portion of FR1 is greater than 6 GHz, FR1 is often referred to as a "sub-6 GHz" band. Similarly, FR2 is often referred to as a "millimeter wave" band despite being different from the extremely high frequency (EHF) band (30 GHz-300 GHz) which is identified by the International Telecommunications Union (ITU) as a "millimeter wave" band. Thus, unless specifically stated otherwise, it should be understood that the term "sub-6 GHz" or the like, if used herein, may broadly represent frequencies less than 6 GHz, frequencies within FR1, and/or mid-band frequencies (e.g., greater than 7.125 GHz). Similarly, unless specifically stated otherwise, it should be understood that the term "millimeter wave" or the like, if used herein, may broadly represent frequencies within the EHF band, frequencies within FR2, and/or mid-band frequencies (e.g., less than 24.25 GHz). It is contemplated that the frequencies included in FR1 and FR2 may be modified, and techniques described herein are applicable to those modified frequency ranges.

As indicated above, FIG. 1 is provided as an example. Other examples may differ from what is described with regard to FIG. 1.

Figure 2:
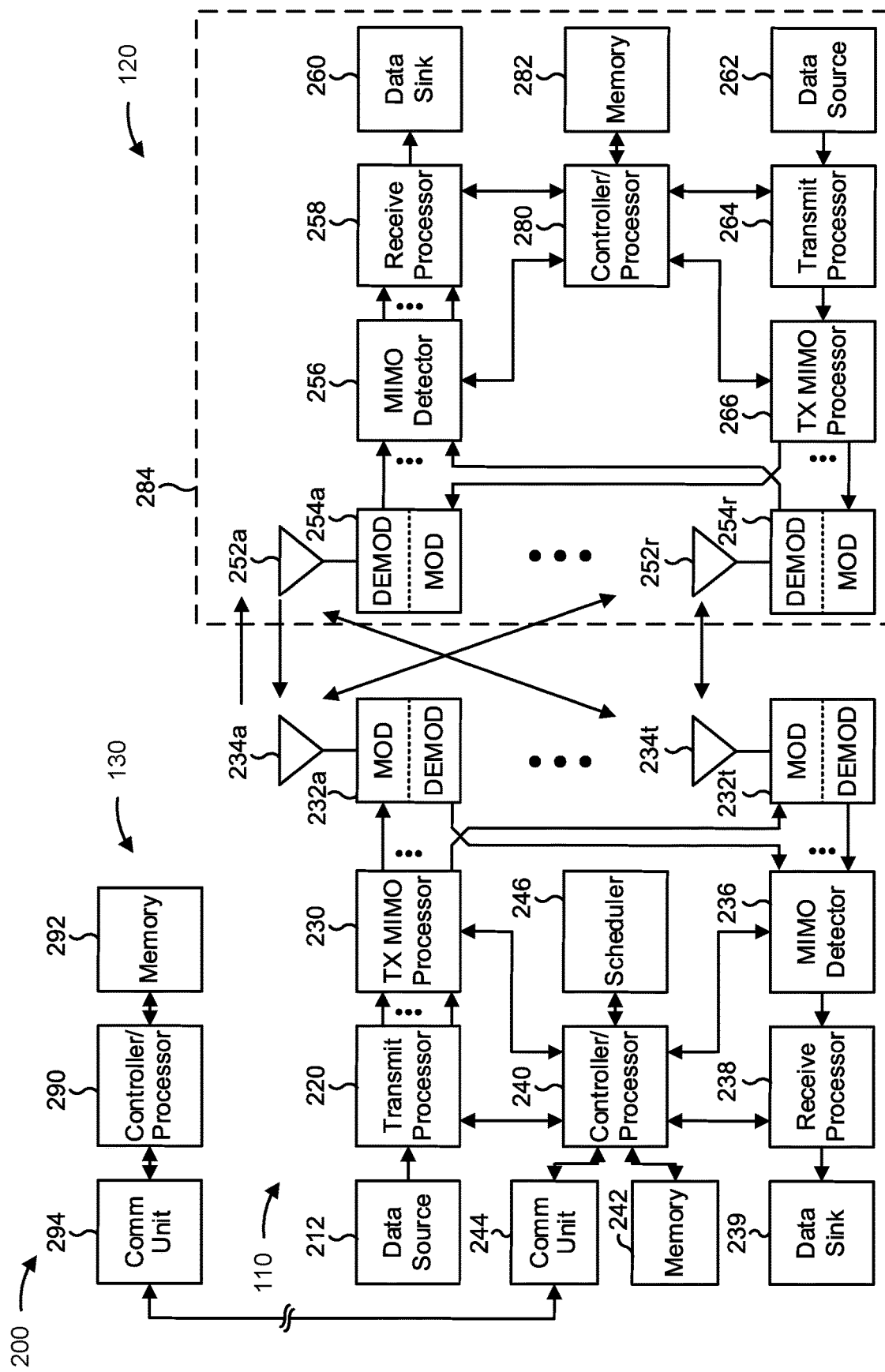
FIG. 2 is a diagram illustrating an example of a base station in communication with a UE in a wireless network, in accordance with the present disclosure.

FIG. 2 is a diagram illustrating an example 200 of a base station 110 in communication with a UE 120 in a wireless network 100, in accordance with the present disclosure. Base station 110 may be equipped with T antennas 234a through 234t, and UE 120 may be equipped with R antennas 252a through 252r, where in general T≥1 and R≥1.

At base station 110, a transmit processor 220 may receive data from a data source 212 for one or more UEs, select one or more modulation and coding schemes (MCS) for each UE based at least in part on channel quality indicators (CQIs) received from the UE, process (e.g., encode and modulate) the data for each UE based at least in part on the MCS(s) selected for the UE, and provide data symbols for all UEs. Transmit processor 220 may also process system information (e.g., for semi-static resource partitioning information (SRPI)) and control information (e.g., CQI requests, grants, and/or upper layer signaling) and provide overhead symbols and control symbols. Transmit processor 220 may also generate reference symbols for reference signals (e.g., a cell-specific reference signal (CRS) or a demodulation reference signal (DMRS)) and synchronization signals (e.g., a primary synchronization signal (PSS) or a secondary synchronization signal (SSS)). A transmit (TX) multiple-input multiple-output (MIMO) processor 230 may perform spatial processing (e.g., precoding) on the data symbols, the control symbols, the overhead symbols, and/or the reference symbols, if applicable, and may provide T output symbol streams to T modulators (MODs) 232a through 232t. Each modulator 232 may process a respective output symbol stream (e.g., for OFDM) to obtain an output sample stream. Each modulator 232 may further process (e.g., convert to analog, amplify, filter, and upconvert) the output sample stream to obtain a downlink signal. T downlink signals from modulators 232a through 232t may be transmitted via T antennas 234a through 234t, respectively.

At UE 120, antennas 252a through 252r may receive the downlink signals from base station 110 and/or other base stations and may provide received signals to demodulators (DEMODs) 254a through 254r, respectively. Each demodulator 254 may condition (e.g., filter, amplify, downconvert, and digitize) a received signal to obtain input samples. Each demodulator 254 may further process the input samples (e.g., for OFDM) to obtain received symbols. A MIMO detector 256 may obtain received symbols from all R demodulators 254a through 254r, perform MIMO detection on the received symbols if applicable, and provide detected symbols. A receive processor 258 may process (e.g., demodulate and decode) the detected symbols, provide decoded data for UE 120 to a data sink 260, and provide decoded control information and system information to a controller/processor 280. The term "controller/processor" may refer to one or more controllers, one or more processors, or a combination thereof. A channel processor may determine a reference signal received power (RSRP) parameter, a received signal strength indicator (RSSI) parameter, a reference signal received quality (RSRQ) parameter, and/or a channel quality indicator (CQI) parameter, among other examples. In some aspects, one or more components of UE 120 may be included in a housing 284.

Network controller 130 may include communication unit 294, controller/processor 290, and memory 292. Network controller 130 may include, for example, one or more devices in a core network. Network controller 130 may communicate with base station 110 via communication unit 294.

Antennas (e.g., antennas 234a through 234t and/or antennas 252a through 252r) may include, or may be included within, one or more antenna panels, antenna groups, sets of antenna elements, and/or antenna arrays, among other examples. An antenna panel, an antenna group, a set of antenna elements, and/or an antenna array may include one or more antenna elements. An antenna panel, an antenna group, a set of antenna elements, and/or an antenna array may include a set of coplanar antenna elements and/or a set of non-coplanar antenna elements. An antenna panel, an antenna group, a set of antenna elements, and/or an antenna array may include antenna elements within a single housing and/or antenna elements within multiple housings. An antenna panel, an antenna group, a set of antenna elements, and/or an antenna array may include one or more antenna elements coupled to one or more transmission and/or reception components, such as one or more components of FIG. 2.

On the uplink, at UE 120, a transmit processor 264 may receive and process data from a data source 262 and control information (e.g., for reports that include RSRP, RSSI, RSRQ, and/or CQI) from controller/processor 280. Transmit processor 264 may also generate reference symbols for one or more reference signals. The symbols from transmit processor 264 may be precoded by a TX MIMO processor 266 if applicable, further processed by modulators 254a through 254r (e.g., for DFT-s-OFDM or CP-OFDM), and transmitted to base station 110. In some aspects, a modulator and a demodulator (e.g., MOD/DEMOD 254) of the UE 120 may be included in a modem of the UE 120. In some aspects, the UE 120 includes a transceiver. The transceiver may include any combination of antenna(s) 252, modulators and/or demodulators 254, MIMO detector 256, receive processor 258, transmit processor 264, and/or TX MIMO processor 266. The transceiver may be used by a processor (e.g., controller/processor 280) and memory 282 to perform aspects of any of the methods described herein, for example, as described with reference to FIGS. 3-11.

At base station 110, the uplink signals from UE 120 and other UEs may be received by antennas 234, processed by demodulators 232, detected by a MIMO detector 236 if applicable, and further processed by a receive processor 238 to obtain decoded data and control information sent by UE 120. Receive processor 238 may provide the decoded data to a data sink 239 and the decoded control information to controller/processor 240. Base station 110 may include communication unit 244 and communicate to network controller 130 via communication unit 244. Base station 110 may include a scheduler 246 to schedule UEs 120 for downlink and/or uplink communications. In some aspects, a modulator and a demodulator (e.g., MOD/DEMOD 232) of the base station 110 may be included in a modem of the base station 110. In some aspects, the base station 110 includes a transceiver. The transceiver may include any combination of antenna(s) 234, modulators and/or demodulators 232, MIMO detector 236, receive processor 238, transmit processor 220, and/or TX MIMO processor 230. The transceiver may be used by a processor (e.g., controller/processor 240) and memory 242 to perform aspects of any of the methods described herein, for example, as described with reference to FIGS. 3-11.

Controller/processor 240 of base station 110, controller/processor 280 of UE 120, and/or any other component(s) of FIG. 2 may perform one or more techniques associated with phase tracking reference signal (PTRS) design for single-carrier waveforms, as described in more detail elsewhere herein. For example, controller/processor 240 of base station 110, controller/processor 280 of UE 120, and/or any other component(s) of FIG. 2 may perform or direct operations of, for example, process 1000 of FIG. 10, process 1100 of FIG. 11, and/or other processes as described herein. Memories 242 and 282 may store data and program codes for base station 110 and UE 120, respectively. In some aspects, memory 242 and/or memory 282 may include a non-transitory computer-readable medium storing one or more instructions (e.g., code and/or program code) for wireless communication. For example, the one or more instructions, when executed (e.g., directly, or after compiling, converting, and/or interpreting) by one or more processors of the base station 110 and/or the UE 120, may cause the one or more processors, the UE 120, and/or the base station 110 to perform or direct operations of, for example, process 1000 of FIG. 10, process 1100 of FIG. 11, and/or other processes as described herein. In some aspects, executing instructions may include running the instructions, converting the instructions, compiling the instructions, and/or interpreting the instructions, among other examples.

In some aspects, UE 120 may include means for transmitting, to a base station, information indicating at least one of a power amplifier sharing configuration or a phase noise sharing configuration for a plurality of layers of a single-carrier communication; means for receiving, from the base station, a PTRS configuration for the plurality of layers based at least in part on at least one of the power amplifier sharing configuration or the phase noise sharing configuration; means for performing the single-carrier communication in accordance with the PTRS configuration; and/or the like. In some aspects, such means may include one or more components of UE 120 described in connection with FIG. 2, such as controller/processor 280, transmit processor 264, TX MIMO processor 266, MOD 254, antenna 252, DEMOD 254, MIMO detector 256, receive processor 258, and/or the like.

In some aspects, base station 110 may include means for receiving, from a UE, information indicating at least one of a power amplifier sharing configuration or a phase noise sharing configuration for a plurality of layers of a single-carrier communication; means for transmitting, to the UE, a PTRS configuration for the plurality of layers based at least in part on at least one of the power amplifier sharing configuration or the phase noise sharing configuration; means for performing the single-carrier communication in accordance with the PTRS configuration; and/or the like. In some aspects, such means may include one or more components of base station 110 described in connection with FIG. 2, such as antenna 234, DEMOD 232, MIMO detector 236, receive processor 238, controller/processor 240, transmit processor 220, TX MIMO processor 230, MOD 232, antenna 234, and/or the like.

While blocks in FIG. 2 are illustrated as distinct components, the functions described above with respect to the blocks may be implemented in a single hardware, software, or combination component or in various combinations of components. For example, the functions described with respect to the transmit processor 264, the receive processor 258, and/or the TX MIMO processor 266 may be performed by or under the control of controller/processor 280.

As indicated above, FIG. 2 is provided as an example. Other examples may differ from what is described with regard to FIG. 2.

Some communication systems may use a single-carrier (SC) waveform in order to reduce peak-to-average power ratio (PAPR), which reduces the required power amplifier (PA) backoff for transmission of the waveform. A lower PA backoff leads to improved transmission performance and improves utilization of transmit power budget. Examples of SC waveforms include DFT-s-OFDM waveforms and SC quadrature amplitude modulation (SC-QAM) waveforms.

Some radio access technologies, such as 5G/NR, provide for communication in frequency ranges above the 6 GHz range, such as millimeter wave frequencies and/or the like. Communication in higher frequency ranges may involve challenges that are not present or are less significant for lower-range communications. For example, communications in higher frequency ranges may involve more phase noise than communications in lower frequency ranges, since the power of phase noise may increase with the carrier frequency of a communication due to oscillator jitter, carrier frequency mismatch, and/or the like. Phase noise may introduce phase drift on communication symbols. To combat phase drift, a transmitter may insert a phase tracking reference signal (PTRS) in a communication, so that a phase error trajectory of the communication can be tracked over time. A PTRS may comprise a pilot signal inserted among data symbols. A receiver may estimate a phase error (e.g., phase drift) based at least in part on a PTRS, and may apply phase compensation to the received signal to mitigate the estimated phase error. A PTRS may be transmitted in a chunk that includes one or more PTRSs.

As another example of a challenge associated with a higher frequency range, a PA (e.g., a PA of a UE or a base station) may have lower efficiency in higher frequency ranges than in lower frequency ranges. For example, a PA may have lower efficiency in Frequency Range 4 (FR4) (e.g., above 114 GHz) than in FR2.

Some RATs such as 5G/NR also provide for multi-layer communications, in which a signal carries multiple data layers corresponding to multiple data ports. Some transmitters may use a shared PA configuration for a multi-layer communication, in which a set of PAs jointly provide amplification of a transmitted signal. Other transmitters may not use a PA sharing configuration for a multi-layer communication. Furthermore, in some cases, phase noise may be shared between layers of a communication (e.g., due to phase coherence of the layers, a shared oscillator of the layers, a Doppler effect that is common to the layers, and/or the like), whereas in other cases, phase noise may not be shared or may be independent for different layers. Thus, in some circumstances, the layers of a communication may be associated with the same phase drift, whereas in other circumstances, the layers of a communication may be associated with different phase drifts.

Because the phase noise sharing configuration and the PA sharing configuration can differ for different multi-layer communications, a one-size-fits-all approach, in which the same PTRS configuration is used for all multi-layer single-carrier communications, may be suboptimal. For example, if PTRSs are configured in both layers of a two-layer single-carrier communication, and the layers share phase noise (e.g., are phase-coherent with each other), then resources of the two layers may be wasted, since a single PTRS would be sufficient to determine the phase error of the two phase-coherent layers. As another example, the PTRS configuration may vary based at least in part on whether a set of PAs is shared between two or more layers. If the set of PAs is shared, then a power boost can be applied for a PTRS that is transmitted on only one layer, whereas if the set of PAs is not shared, then a single-layer PTRS may not be capable of using a power boost. These challenges may lead to a PTRS configuration that is either overly conservative and involves more resource overhead than is needed to determine phase errors of each layer, or that does not provide sufficient information to determine phase errors of each layer.

Some techniques and apparatuses described herein provide PTRS configurations based at least in part on a phase noise sharing configuration and a PA sharing configuration of a multi-layer communication. For example, the PTRS configuration may indicate whether PTRSs are to be transmitted concurrently on multiple layers, or with one or more zero-power (ZP) PTRSs configured on one layer while a non-zero-power (NZP) PTRS is transmitted on another layer. As another example, the PTRS configuration may indicate whether a power boost is to be applied for a PTRS of a multi-layer communication based at least in part on a PA sharing configuration associated with the multi-layer communication. In some aspects, the PTRSs may be inserted in different time locations within a symbol in two or more layers. Some techniques and apparatuses described herein also provide signaling associated with configuration of a PTRS, such as signaling of a PA sharing capability and/or a phase noise sharing capability, signaling of a preferred PTRS waveform, signaling of a PTRS configuration, and/or the like. In this way, a PTRS configuration that is appropriate for a PA sharing configuration and/or a phase noise sharing configuration of a UE can be applied, thereby improving resource utilization and phase error measurement for multi-layer single-carrier communications.

Figure 3:
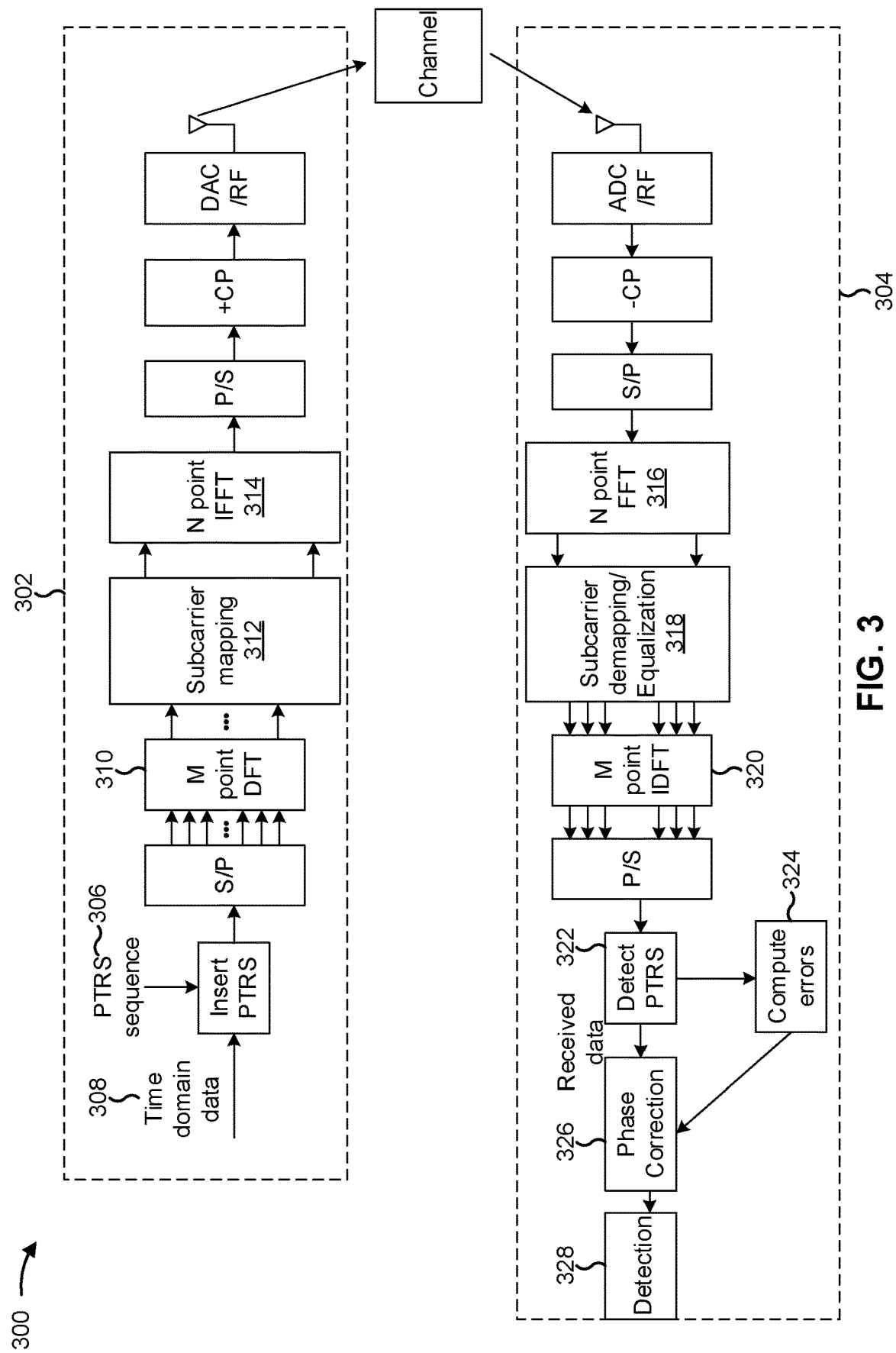
FIG. 3 is a diagram illustrating an example of discrete Fourier transform spread orthogonal frequency division multiplexing (DFT-s-OFDM) incorporating a phase tracking reference signal, in accordance with the present disclosure.

FIG. 3 is a diagram illustrating an example 300 of discrete Fourier transform spread orthogonal frequency division multiplexing (DFT-s-OFDM) incorporating a phase tracking reference signal, in accordance with various aspects of the present disclosure. DFT-s-OFDM is an example of a single-carrier waveform, which may provide improved PAPR relative to a multi-carrier waveform such as traditional OFDM without DFT spreading. Operations performed by a transmitter (e.g., UE 120, BS 110, and/or the like) are shown by reference number 302, and operations performed by a receiver (e.g., UE 120, BS 110, and/or the like) are shown by reference number 304. The operations described in connection with example 300 may be performed by a processor of the UE 120, such as controller/processor 280 (e.g., a baseband processor) and/or the like.

As shown by reference number 306, the transmitter may insert one or more PTRSs into a time-domain data stream 308. A PTRS may be associated with a PTRS configuration. The PTRS configuration may indicate a chunk size and a number of chunks associated with the PTRS, among other things. For example, a chunk size may indicate how many PTRSs (e.g., a number of pilot reference signals) are included in a chunk, and a number of chunks may indicate how many chunks are included in a symbol. A chunk comprises one or more PTRSs, and chunks of PTRSs are inserted into a data stream to generate a signal including PTRSs. A chunk may also be referred to as a PTRS group. The PTRS configuration may also indicate a pattern for PTRS insertion. Two examples of patterns for PTRS insertion are a head-tail pattern and a non-head-tail pattern. In a non-head-tail pattern, PTRSs are uniformly inserted (e.g., every two data segments of a symbol, every four data segments of a symbol, and/or the like). In a head-tail pattern, PTRS may be inserted at a start of a symbol (e.g., between the cyclic prefix and a first data segment of the symbol), at an end of a symbol, and/or in one or more intermediate locations. In some aspects, the PTRS configuration may indicate a sequence for a PTRS, a waveform for a PTRS, and/or the like.

The transmitter may parallelize the time-domain data stream and PTRSs, and the transmitter may perform DFT spreading of the parallelized data stream as shown by reference number 310. After performing DFT spreading, the transmitter may map the DFT spread data to subcarriers for transmission, as shown by reference number 312, and may perform an inverse fast Fourier transform (IFFT), as shown by reference number 314. Thus, the transmitter may generate a single-carrier DFT-s-OFDM waveform. As further shown, the transmitter may perform serialization (P/S), add a cyclic prefix (+CP), and may convert the digital baseband signal to an analog signal for radio transmission (digital to analog conversion (DAC) to radio frequency (RF)). The transmitter may transmit the signal to the receiver.

The receiver may generate a digital signal from a received radio frequency signal (e.g., analog to digital conversion (ADC) and RF), remove a cyclic prefix (-CP), and parallelize the digital signal. The receiver may perform a fast Fourier transform (FFT) on the parallelized signal, as shown by reference number 316, and may perform subcarrier demapping, also referred to as frequency domain equalization, to extract data from the frequency domain signal, as shown by reference number 318. The receiver may perform inverse DFT (IDFT) spreading, shown by reference number 320, to generate a parallelized data stream, and may perform serialization of the parallelized data stream to generate a demodulated time-domain data stream. As shown by reference number 322, the receiver may detect the PTRSs in the demodulated data stream. The receiver may compute one or more phase errors for the demodulated data stream, as shown by reference number 324. As shown by reference number 326, the receiver may perform phase correction based at least in part on the phase errors, to generate a phase-corrected baseband signal. The receiver may perform detection to detect data symbols of the phase-corrected baseband symbols, as shown by reference number 328. Thus, the PTRS can be used to perform phase error detection and correction for a single-layer communication.

Another form of single-carrier waveform is the SC-QAM waveform. SC-QAM does not involve DFT at the transmitter or IDFT at the receiver, and is thus less computationally complex than DFT-s-OFDM. The decreased computational complexity of SC-QAM may be useful at higher frequencies and larger bandwidths. To generate an SC-QAM waveform, a transmitter may insert a PTRS into a data stream, perform pulse shaping, and add a cyclic prefix, then may transmit the resulting SC-QAM waveform. A receiver may receive the SC-QAM waveform, remove the cyclic prefix, perform match filtering, perform time-domain equalization (e.g., using a time-domain filter derived from a frequency-domain minimum mean square error algorithm), and may apply a PTRS reception algorithm to detect the inserted PTRSs, determine phase error, and apply phase correction to offset the phase error.

The PTRS detection for SC-QAM can be performed on a full-symbol basis or on a per-sample basis. On the full-symbol basis, the receiver may identify all PTRS samples in a symbol, and may then determine phase error and apply phase correction based at least in part on the determined phase error. On the per-sample basis, the receiver may iteratively process samples of the symbol to identify PTRSs, may perform causal estimation based at least in part on the iteratively identified PTRSs, and may perform phase correction based at least in part on the causal estimation.

As indicated above, FIG. 3 is provided as an example. Other examples may differ from what is provided with regard to FIG. 3.

Figure 4:
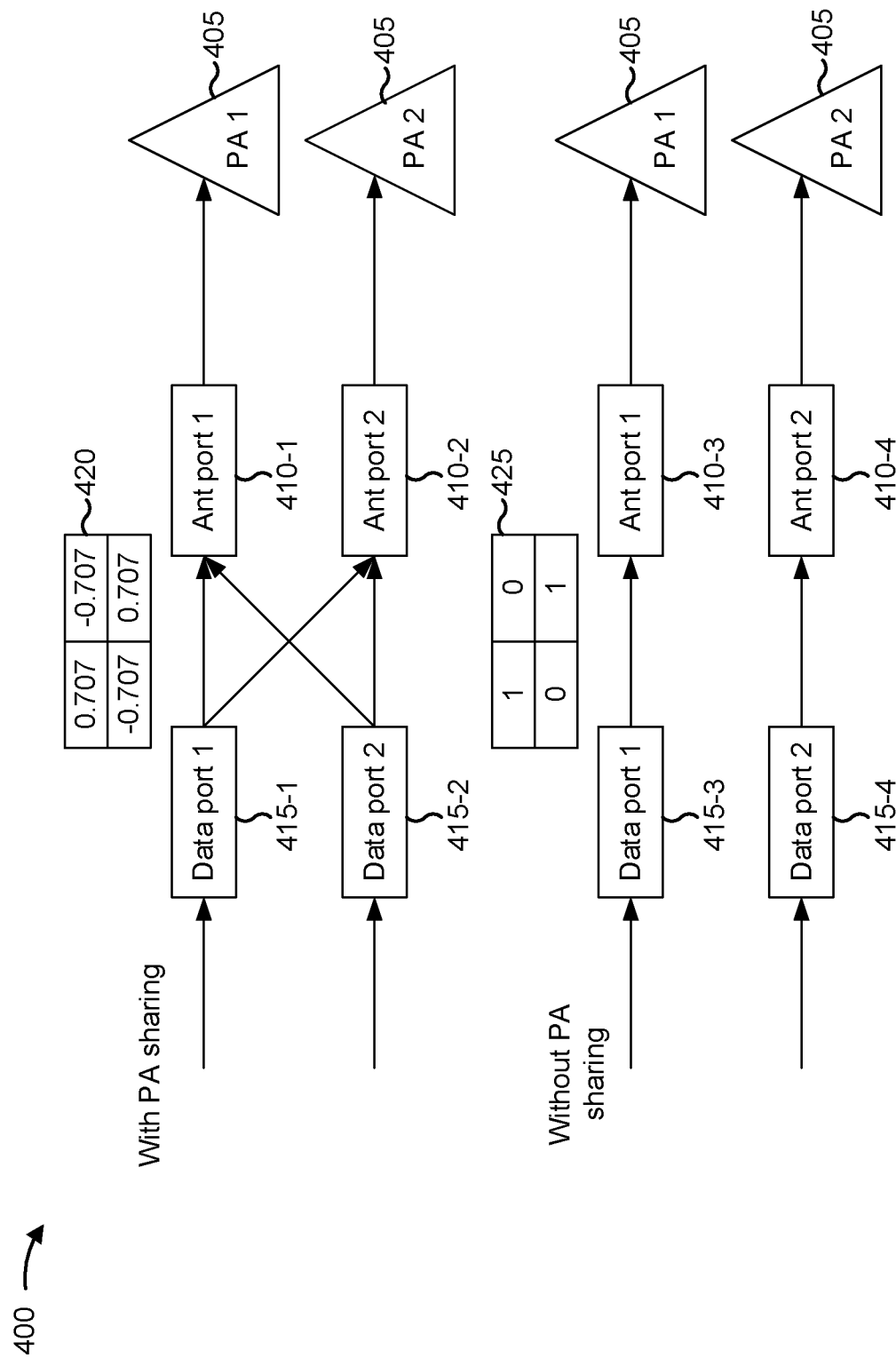
FIG. 4 is a diagram illustrating an example of transmission configurations with power amplifier (PA) sharing and without PA sharing, in accordance with the present disclosure.

FIG. 4 is a diagram illustrating an example 400 of transmission configurations with power amplifier (PA) sharing and without PA sharing, in accordance with the present disclosure. A transmission configuration with PA sharing is shown in the top part of FIG. 4, and a transmission configuration without PA sharing is shown in the bottom part of FIG. 4. A radio frequency (RF) chain of a transmitter may include one or more PAs 405. The one or more PAs 405 may amplify signals, received via one or more respective antenna ports 410, for transmission by the transmitter. A set of antenna ports 410 may be mapped to a set of data ports 415. A data port 415 may correspond to a layer of a multi-layer communication. Therefore, in example 400, both transmission configurations include two data layers.

Data ports 415 may be mapped to antenna ports 410 based at least in part on a precoding matrix. An example of a precoding matrix using PA sharing is shown by reference number 420, and an example of a precoding matrix without PA sharing is shown by reference number 425. The precoding matrix shown by reference number 420 maps each data port 415-1 and 415-2 to respective antenna ports 410-1 and 410-2. If, at a given sample, the data stream from data port 415-1 includes no data, then the data stream from data port 415-2 can be power boosted at the given sample so that the total transmission power of the set of antenna ports 410 is unchanged. Thus, power can be shared between data ports 415-1 and 415-2 when PA sharing is enabled.

The precoding matrix shown by reference number 425 maps data ports 415-3 and 415-4 to respective single antenna ports 410-3 and 410-4. Thus, if, at a given sample, the data stream from data port 415-3 includes no data, then the transmit power from data port 415-4 cannot be boosted in the given sample, since the data ports 415-3 and 415-4 are associated with separate antenna ports 410 and therefore separate PAs 405.

As indicated above, FIG. 4 is provided as an example. Other examples may differ from what is provided with regard to FIG. 4.

Figure 5:
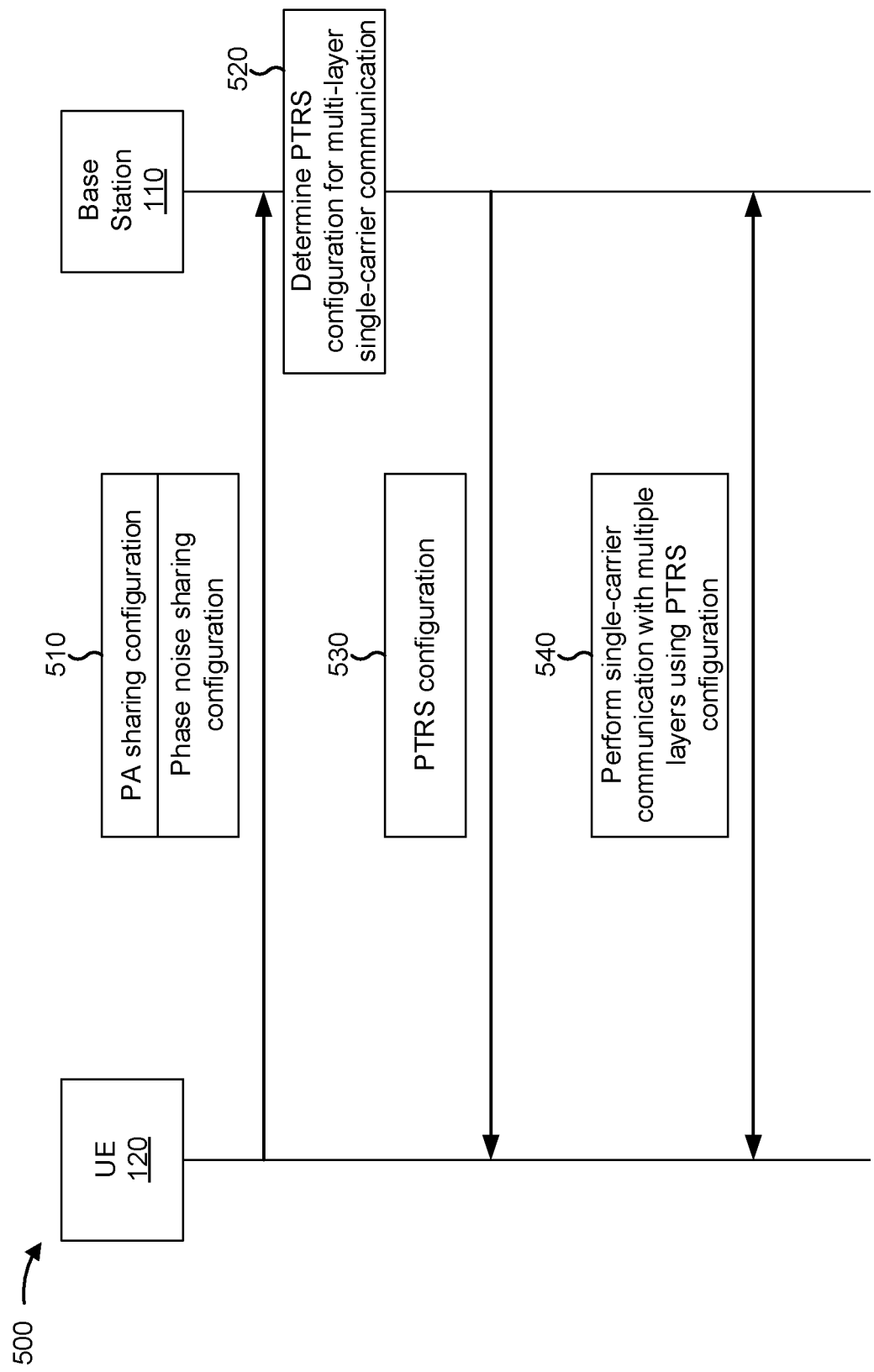
FIG. 5 is a diagram illustrating an example of signaling associated with phase tracking reference signal (PTRS) configuration based at least in part on a PA sharing configuration and a phase noise sharing configuration, in accordance with the present disclosure.

FIG. 5 is a diagram illustrating an example 500 of signaling associated with PTRS configuration based at least in part on a PA sharing configuration and a phase noise sharing configuration, in accordance with the present disclosure. As shown, example 500 includes a UE 120 and a BS 110. Example 500 involves single-carrier communication between the UE 120 and the BS 110, for example, using a DFT-s-OFDM waveform or an SC-FDM waveform. The single-carrier communication can include an uplink communication and/or a downlink communication.

As shown, the UE 120 may transmit information 510 to the BS 110. The information 510 may indicate a phase noise sharing configuration for a single-carrier communication including multiple layers and/or a PA sharing configuration for the single-carrier communication. For example, the UE 120 may report whether data layers of the single-carrier communication share phase noise and/or a set of PAs. In some aspects, the information 510 may include information indicating a PTRS waveform, such as a preferred PTRS waveform. For example, the information 510 may indicate a preferred number of layers of the single-carrier communication to include a PTRS, a number of PTRSs to be provided in a given layer within a symbol, a number of chunks to be provided in a given layer within a symbol in the given layer, a number of PTRSs per chunk, and/or the like. In some aspects, the information indicating the PTRS waveform may indicate the phase noise sharing configuration and/or the PA sharing configuration. For example, a PTRS waveform selected by the UE 120 may be associated with a particular phase noise sharing configuration and/or PA sharing configuration, so the information indicating the PTRS waveform may implicitly indicate the phase noise sharing configuration and/or the PA sharing configuration. The information 510 may include capability information, radio resource control signaling, and/or the like.

As shown by reference number 520, the BS 110 may determine a PTRS configuration for the single-carrier communication including the multiple layers. For example, the BS 110 may determine a PTRS configuration based at least in part on the information 510. The PTRS configuration may indicate locations of PTRSs or chunks (e.g., ZP PTRSs and/or NZP PTRSs), a number of data layers in which to include a PTRS, a number of chunks per symbol, a number of PTRSs per chunk, a size of ZP PTRS, and/or the like. For example, the PTRS configuration may indicate a PTRS waveform for the single-carrier communication. In some aspects, the PTRS configuration may indicate a power boosting configuration. A power boosting configuration may indicate whether a power boost is to be used for an NZP PTRS in a given layer. In some aspects, the PTRS configuration may indicate a cyclic shift for the PTRS. For example, the PTRS configuration may indicate a location of an NZP PTRS based at least in part on a non-head-tail pattern with a modified cyclic shift value relative to the non-head-tail pattern. In this case, the BS 110 may signal information indicating the cyclic shift (e.g., as a part of the PTRS configuration or separate from the PTRS configuration).

The BS 110 may determine the PTRS configuration based at least on the phase noise sharing configuration and/or the PA sharing configuration. As a few general examples, if the phase noise sharing configuration indicates that phase noise is shared between data layers, then the BS 110 may determine a PTRS configuration in which a PTRS is provided on only a first layer, thereby reducing PTRS overhead on a second layer. As another example, if the phase noise sharing configuration indicates that phase noise is not shared between layers, then the BS 110 may determine a PTRS configuration in which PTRSs are provided on all layers. As yet another example, if the PA sharing configuration indicates that a set of PAs is not shared between layers, then the BS 110 may determine a PTRS configuration indicating that a power boost is not to be applied for an NZP PTRS in a given layer, or a PTRS configuration indicating that PTRSs are to be concurrently inserted in all layers in order to increase received power of the PTRSs. As still another example, if the PA sharing indicates that a set of PAs is shared between layers, the BS 110 may determine a PTRS configuration indicating that a power boost is to be applied to an NZP PTRS in a first layer if the NZP PTRS is concurrent with a ZP PTRS in a second layer. For a more detailed description of various PTRS configurations corresponding to combinations of PA sharing configurations and phase noise sharing configurations, refer to the description accompanying FIGS. 6-9.

As shown, the BS 110 may transmit information 530 indicating the PTRS configuration to the UE 120. For example, the BS 110 may transmit the information 530 using radio resource control signaling, medium access control (MAC) signaling (e.g., a MAC control element), downlink control information (DCI), and/or the like.

As shown by reference number 540, the BS 110 and the UE 120 may perform the single-carrier communication in accordance with the PTRS configuration. For example, a transmitter of the single-carrier communication (e.g., the BS 110 or the UE 120) may insert PTRSs (e.g., ZP PTRSs and/or NZP PTRSs) in one or more layers of the single-carrier communication. A receiver of the single-carrier communication (e.g., the UE 120 or the BS 110) may detect the PTRSs based at least in part on the PTRS configuration, determine phase error for the single-carrier communication, and apply phase correction to offset the phase error. Thus, PTRSs can be inserted in a single-carrier communication with multiple data layers, thereby improving the accuracy and reliability of multi-layer communication and reducing an impact of phase drift on multi-layer communication. Thus, higher-frequency communication using multiple layers is improved.

As indicated above, FIG. 5 is provided as an example. Other examples may differ from what is provided with regard to FIG. 5.

FIGS. 6-9 are diagrams illustrating examples 600, 700, 800, and 900 of PTRS configurations for multi-layer single-carrier communications, in accordance with the present disclosure.

Figure 6:
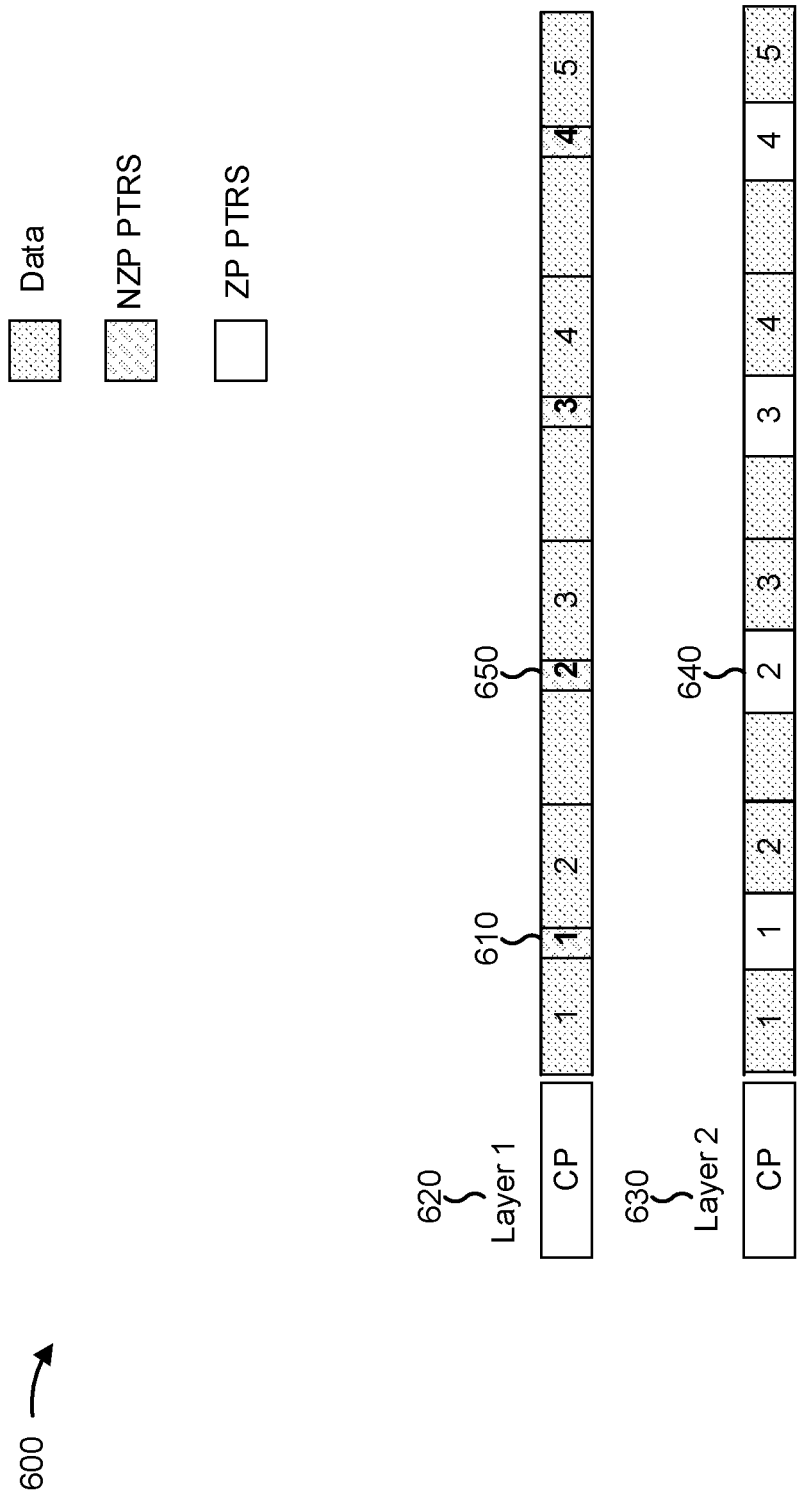
FIGS. 6-9 are diagrams illustrating examples of PTRS configurations for multi-layer single-carrier communications, in accordance with the present disclosure.
Figure 7:
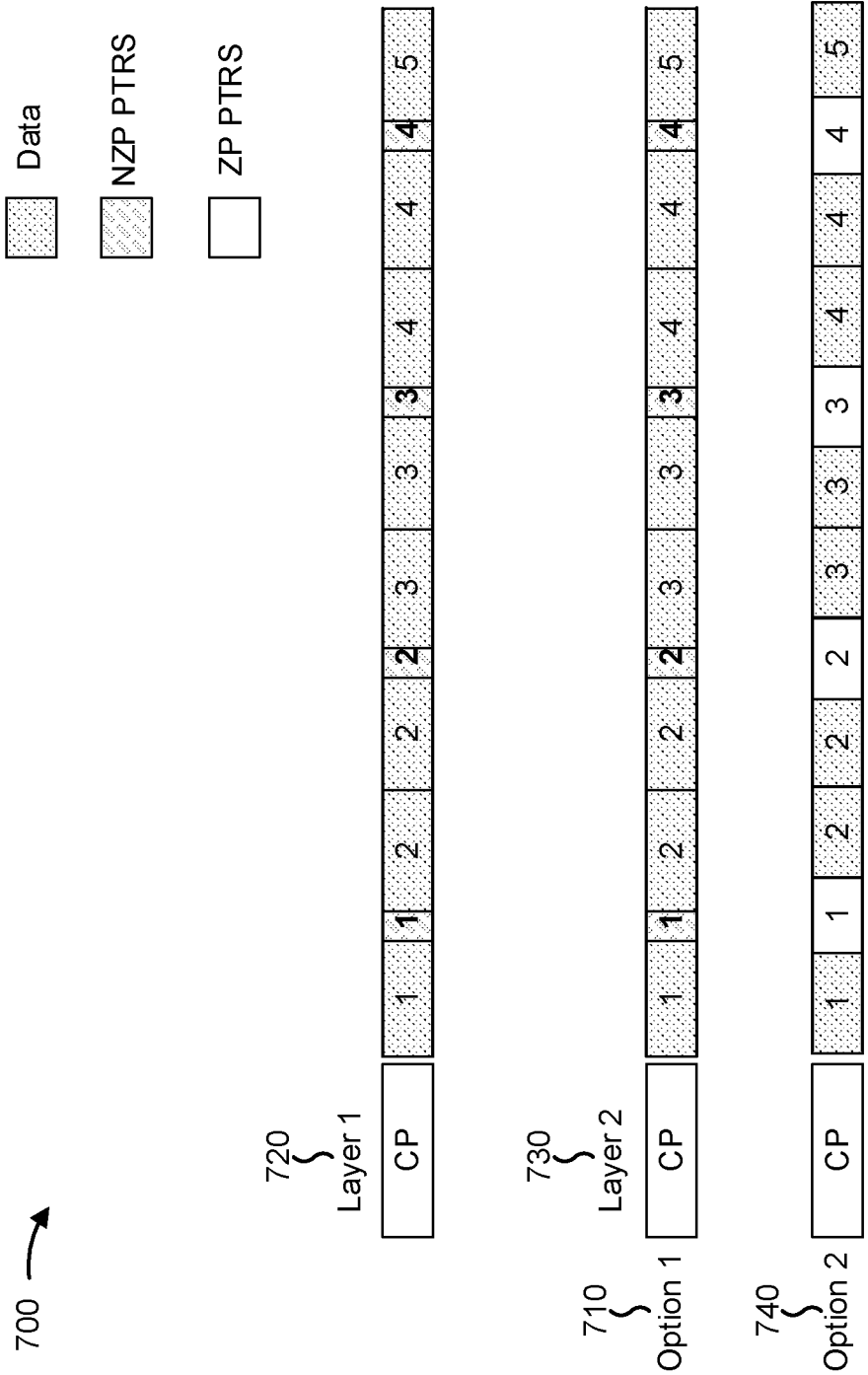

Example 600 of FIG. 6 shows a PTRS configuration that can be used if phase noise is shared (e.g., a phase noise sharing configuration indicates that the phase noise is shared) and amplification is shared (e.g., a PA sharing configuration indicates that a set of PAs is shared across all data ports/layers of the multi-layer communication). As shown in example 600, and by reference number 610, in this case, NZP PTRSs can be inserted in a first layer 620 to identify phase errors across all layers 620 and 630, since phase noise is shared across all layers.

As further shown, a second layer 630 may include ZP PTRSs corresponding to the NZP PTRSs of the first layer 620. For example, since PA sharing is enabled in example 600, the NZP PTRSs of the first layer can be power boosted at a given sample if the second layer includes no data at the given sample. Here, a ZP PTRS 640 corresponds to an NZP PTRS 650. For example, the ZP PTRS 640 includes the NZP PTRS 650 in the time domain. As further shown, the ZP PTRS 640 also includes a portion of data surrounding the NZP PTRS 650 in the time domain. For example, the ZP PTRS 640 may have a larger chunk size than the NZP PTRS 650, which may reduce the impact of delay spread on the NZP PTRS 650. For example, the power of the PTRSs can be boosted (for example, by 3 decibels), which improves performance of the PTRS.

Example 600 shows a non-head-tail pattern, where the PTRSs are provided at an even spacing. Here, PTRSs 1 and 4 (referred to as PTRSs in a head-tail position) are evenly spaced in a cyclic fashion with regard to data segments 1 and 5. In some aspects, the PTRSs may be positioned based at least in part on a circular shift (e.g., a cyclic shift).

Example 700 shows a PTRS configuration that can be used if a phase noise sharing configuration is shared and a set of PAs is not shared. In this case, in a first option 710, PTRSs are provided in both layers 720 and 730 of the communications. In a second option 740, PTRSs are provided in only a first layer 720. The first option 710 may involve more overhead than the second option 740, and may provide a higher received power for the PTRSs. The second option 740 may involve less inter-layer interference than the first option 710, at the cost of a lower transmit power.

Figure 8:
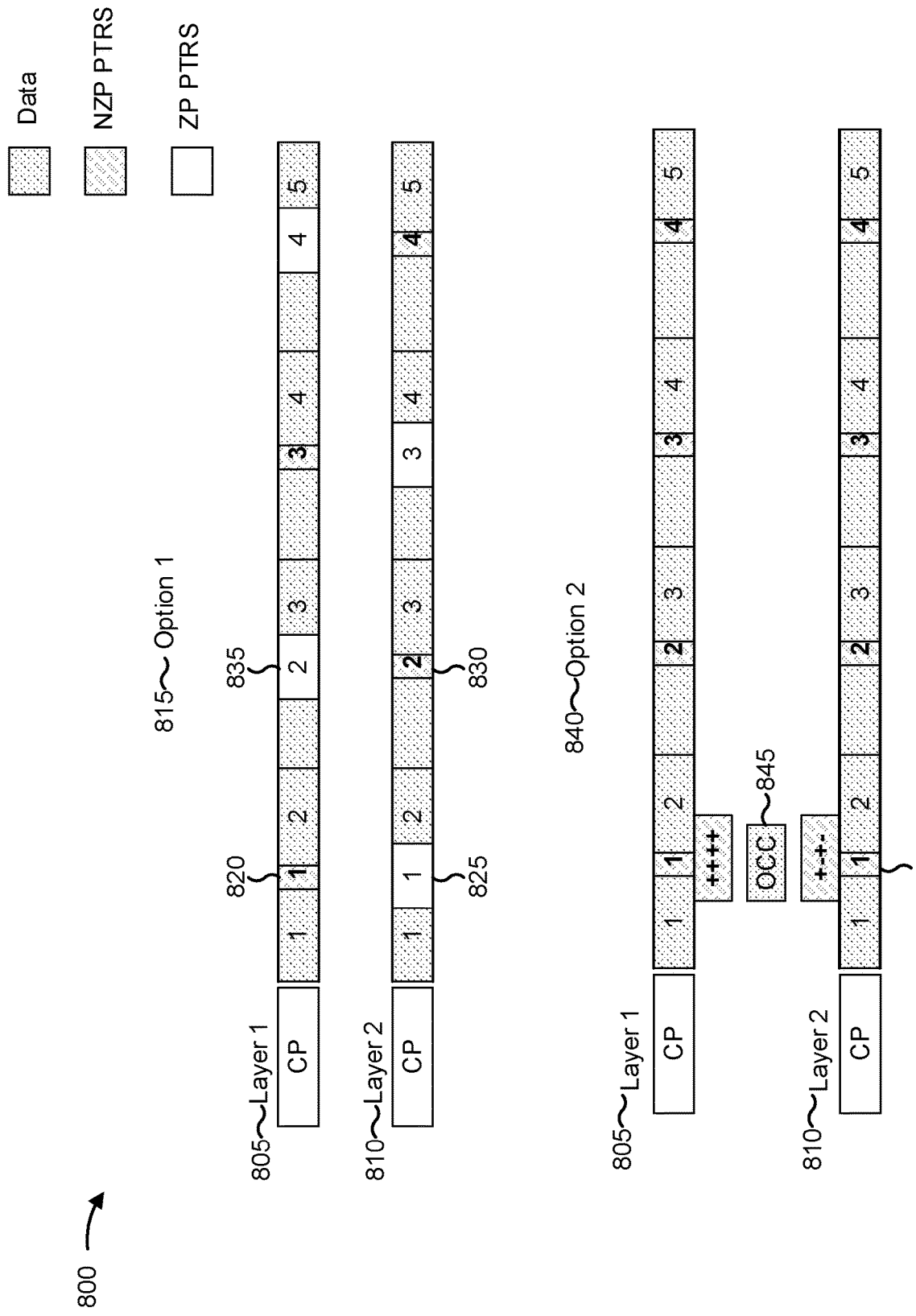

Example 800 of FIG. 8 shows a PTRS configuration that can be used if phase noise is not shared and a set of PAs is not shared across all data layers (e.g., the phase noise sharing configuration indicates that phase noise is not shared and the PA sharing configuration indicates that the set of PAs is not shared). Thus, the two layers 805 and 810 may both include NZP PTRSs, since the phase error of one layer is not necessarily the same as the phase error of the other layer. A first option is shown by reference number 815. In the first option, an NZP PTRS 820 in a first layer 805 is configured at a same sample as a ZP PTRS 825 in a second layer 810, and an NZP PTRS 830 in the second layer 810 is configured at a same sample as a ZP PTRS 835 in the first layer 805. The first option may provide more accurate phase error estimation within a chunk than the second option, but may provide fewer chunks in a given symbol. A second option is shown by reference number 840. In the second option, chunks of PTRSs are provided in both layers 805 and 810 at a given sample, and the PTRSs within the chunks are encoded using orthogonal cover coding (OCC), as shown by reference number 845. The OCC may be applied at a per-PTRS granularity. For example, there may be 4 PTRSs in the chunk shown by reference number 850, so an OCC of +−+− is applied. Thus, the PTRS chunks of the two layers can be differentiated from each other. The second option may provide more PTRSs/chunks in a given symbol, and may involve more inter-layer interference within a given chunk.

Figure 9:

Example 900 of FIG. 9 shows a PTRS configuration that can be used if phase noise is not shared and a set of PAs is shared across two data layers. As in example 800, the two layers 910 and 920 may both include PTRSs, since the phase error of one layer cannot necessarily be used to determine the phase error of the other layer. In example 900, NZP PTRSs are configured in different samples of the layers 910 and 920. An NZP PTRS in a first layer 910 is configured at a same sample as a ZP PTRS in a second layer 920, and an NZP PTRS in the second layer 920 is configured at a same sample as a ZP PTRS in the first layer 910. Furthermore, since PA sharing is enabled in example 900, the NZP PTRSs may be configured with a power boost (e.g., 3 dB and/or the like), which improves performance of the NZP PTRSs. While the two layers 910 and 920 include a same number of NZP PTRSs as each other, and a same number of ZP PTRSs as each other, in some aspects, different layers may include different numbers of NZP PTRSs and/or different numbers of ZP PTRSs.

In some aspects, NZP PTRSs on the first layer 910 and the second layer 920 may be transmitted at the same time and may be encoded using OCC at a given sample. In this case, the NZP PTRSs may be transmitted without a power boost. In some aspects, locations of the NZP PTRSs may be determined (e.g., derived) based at least in part on a non-heads-tails pattern with a modified cyclic shift value (e.g., a modified cyclic shift value relative to a cyclic shift value of the non-heads-tails pattern).

As indicated above, FIGS. 6-9 are provided as examples. Other examples may differ from what is provided with regard to FIGS. 6-9.

Figure 10:
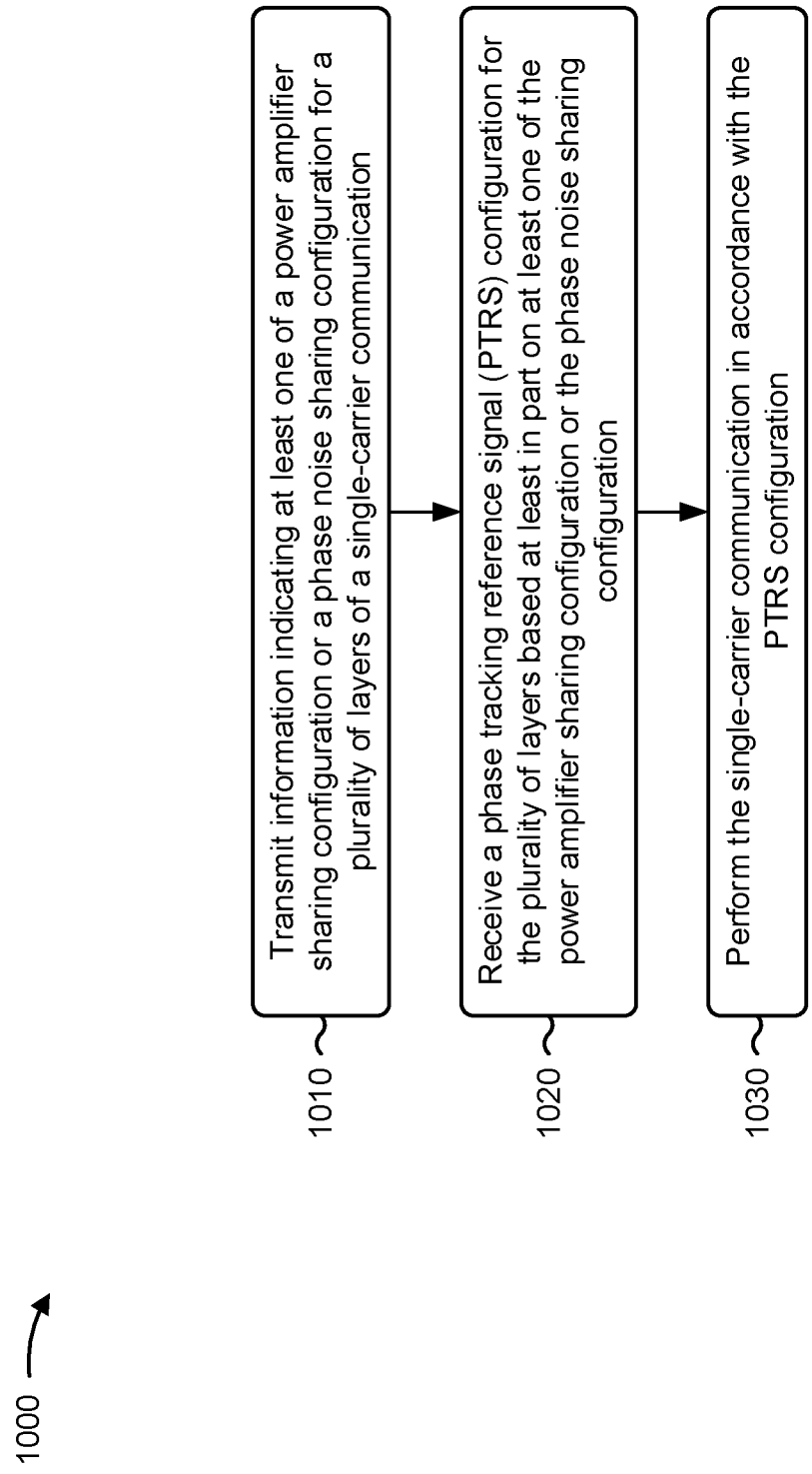
FIGS. 10 and 11 are diagrams illustrating example processes associated with PTRS configuration for a multi-layer communication, in accordance with the present disclosure.

FIG. 10 is a diagram illustrating an example process 1000 performed, for example, by a UE, in accordance with the present disclosure. Example process 1000 is an example where the UE (e.g., UE 120 and/or the like) performs operations associated with phase tracking reference signal (PTRS) design for a single-carrier waveform with multiple data layers.

As shown in FIG. 10, in some aspects, process 1000 may include transmitting, to a base station, information indicating at least one of a power amplifier sharing configuration or a phase noise sharing configuration for a plurality of layers of a single-carrier communication (block 1010). For example, the UE (e.g., using receive processor 258, transmit processor 264, controller/processor 280, memory 282, and/or the like) may transmit, to a base station, information indicating at least one of a power amplifier sharing configuration or a phase noise sharing configuration for a plurality of layers of a single-carrier communication, as described above.

As further shown in FIG. 10, in some aspects, process 1000 may include receiving, from the base station, a PTRS configuration for the plurality of layers based at least in part on at least one of the power amplifier sharing configuration or the phase noise sharing configuration (block 1020). For example, the UE (e.g., using receive processor 258, transmit processor 264, controller/processor 280, memory 282, and/or the like) may receive, from the base station, a PTRS configuration for the plurality of layers based at least in part on at least one of the power amplifier sharing configuration or the phase noise sharing configuration, as described above.

As further shown in FIG. 10, in some aspects, process 1000 may include performing the single-carrier communication in accordance with the PTRS configuration (block 1030). For example, the UE (e.g., using receive processor 258, transmit processor 264, controller/processor 280, memory 282, and/or the like) may perform the single-carrier communication in accordance with the PTRS configuration, as described above.

Process 1000 may include additional aspects, such as any single aspect or any combination of aspects described below and/or in connection with one or more other processes described elsewhere herein.

In a first aspect, the PTRS configuration indicates that each layer, of the plurality of layers, is to include one or more PTRSs.

In a second aspect, the one or more PTRSs comprise a plurality of PTRSs that are inserted at different times within a symbol.

In a third aspect, a PTRS of a first layer, of the plurality of layers, is aligned in time with a PTRS of a second layer of the plurality of layers.

In a fourth aspect, the PTRS of the first layer and the PTRS of the second layer are encoded using an orthogonal cover code.

In a fifth aspect, the PTRS of the first layer and the PTRS of the second layer comprise respective PTRS chunks.

In a sixth aspect, the PTRS configuration indicates that a first layer, of the plurality of layers, includes a zero-power PTRS and that a second layer, of the plurality of layers, includes a non-zero-power PTRS corresponding to the zero-power PTRS.

In a seventh aspect, the PTRS configuration indicates a power boost for the non-zero-power PTRS.

In an eighth aspect, the PTRS configuration indicates that no power boost is to be used for the non-zero-power PTRS.

In a ninth aspect, the zero-power PTRS is associated with a larger chunk size than the non-zero-power PTRS.

In a tenth aspect, the zero-power PTRS includes the non-zero-power PTRS and at least a portion of one or more symbols adjacent to the non-zero-power PTRS.

In an eleventh aspect, the non-zero-power PTRS is associated with a head-tail pattern, and a location of the zero-power PTRS is based at least in part on a cyclic shift.

In a twelfth aspect, a location of the non-zero-power PTRS is derived based at least in part on a non-head-tail pattern with a different cyclic shift value than a pattern used to derive a location of the zero-power PTRS.

In a thirteenth aspect, the first layer includes a non-zero-power PTRS and the second layer includes a zero-power PTRS corresponding to the non-zero-power PTRS.

In a fourteenth aspect, the power amplifier sharing configuration indicates that a power amplifier of the UE is shared between the plurality of layers, the phase noise sharing configuration indicates that phase noise is shared between the plurality of layers, and the PTRS configuration indicates that a PTRS is transmitted in one layer of the plurality of layers.

In a fifteenth aspect, the power amplifier sharing configuration indicates that a power amplifier of the UE is not shared between the plurality of layers, and the phase noise sharing configuration indicates that phase noise is shared between the plurality of layers.

In a sixteenth aspect, each layer of the plurality of layers includes one or more non-zero-power PTRSs.

In a seventeenth aspect, a first layer of the plurality of layers includes one or more non-zero-power PTRSs, and a second layer of the plurality of layers includes one or more zero-power PTRSs.

In an eighteenth aspect, the power amplifier sharing configuration indicates that a power amplifier of the UE is not shared between the plurality of layers, and the phase noise sharing configuration indicates that phase noise is not shared between the plurality of layers.

In a nineteenth aspect, a first layer of the plurality of layers includes one or more first non-zero-power PTRSs, a second layer of the plurality of layers includes one or more second non-zero-power PTRSs, and the one or more first non-zero-power PTRSs do not overlap the one or more second non-zero-power PTRSs.

In a twentieth aspect, each layer of the plurality of layers includes one or more non-zero-power PTRSs, and the one or more non-zero-power PTRSs are encoded using an orthogonal cover code.

In a twenty-first aspect, the power amplifier sharing configuration indicates that a power amplifier of the UE is shared between the plurality of layers, and the phase noise sharing configuration indicates that phase noise is not shared between the plurality of layers.

In a twenty-second aspect, a first layer of the plurality of layers includes one or more first non-zero-power PTRSs, a second layer of the plurality of layers includes one or more second non-zero-power PTRSs, and the one or more first non-zero-power PTRSs do not overlap the one or more second non-zero-power PTRSs.

In a twenty-third aspect, each layer of the plurality of layers includes one or more non-zero-power PTRSs, and the one or more non-zero-power PTRSs are encoded using an orthogonal cover code.

In a twenty-fourth aspect, process 1000 includes transmitting, to the base station, information indicating a preferred PTRS waveform.

In a twenty-fifth aspect, the information indicating the preferred PTRS waveform indicates at least one of a number of layers included in the plurality of layers, a number of PTRSs per layer, or a number of PTRS chunks per layer.

In a twenty-sixth aspect, the PTRS configuration indicates a PTRS waveform for the single-carrier communication.

In a twenty-seventh aspect, a first layer of the plurality of layers is associated with a different PTRS configuration than a second layer of the plurality of layers.

In a twenty-eighth aspect, the single-carrier communication comprises an uplink communication.

In a twenty-ninth aspect, the single-carrier communication comprises a downlink communication.

In a thirtieth aspect, a PTRS of the single-carrier communication and data of the single-carrier communication are mixed in time, and discrete Fourier transform spreading is applied for the single-carrier communication before orthogonal frequency division multiplexing modulation of the single-carrier communication.

Although FIG. 10 shows example blocks of process 1000, in some aspects, process 1000 may include additional blocks, fewer blocks, different blocks, or differently arranged blocks than those depicted in FIG. 10. Additionally, or alternatively, two or more of the blocks of process 1000 may be performed in parallel.

Figure 11:
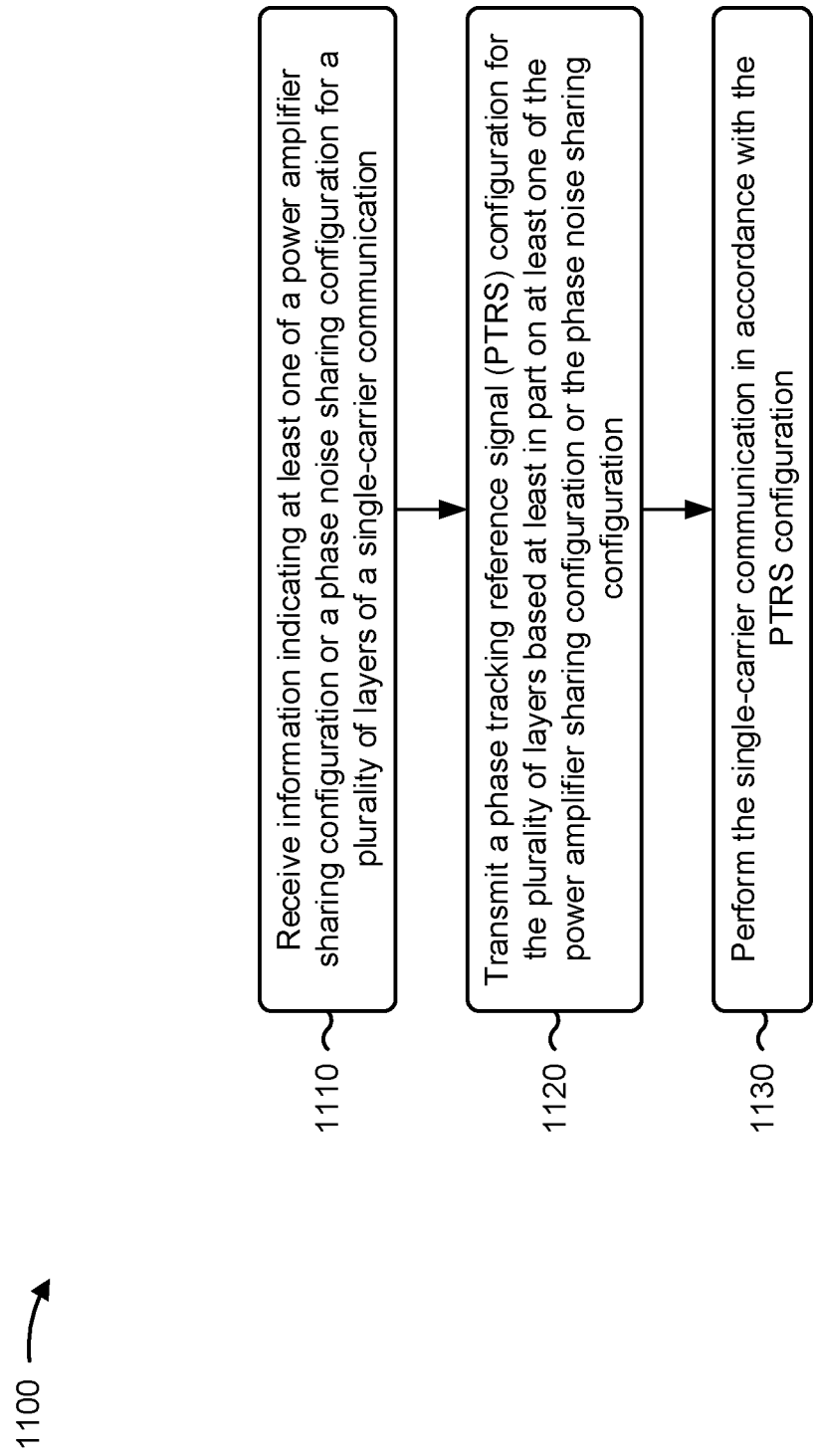

FIG. 11 is a diagram illustrating an example process 1100 performed, for example, by a base station, in accordance with the present disclosure. Example process 1100 is an example where the base station (e.g., base station 110 and/or the like) performs operations associated with phase tracking reference signal (PTRS) design for single-carrier waveform with multiple data layers.

As shown in FIG. 11, in some aspects, process 1100 may include receiving, from a UE, information indicating at least one of a power amplifier sharing configuration or a phase noise sharing configuration for a plurality of layers of a single-carrier communication (block 1110). For example, the base station (e.g., using transmit processor 220, receive processor 238, controller/processor 240, memory 242, and/or the like) may receive, from a UE (e.g., UE 120), information indicating at least one of a power amplifier sharing configuration or a phase noise sharing configuration for a plurality of layers of a single-carrier communication, as described above.

As further shown in FIG. 11, in some aspects, process 1100 may include transmitting, to the UE, a PTRS configuration for the plurality of layers based at least in part on at least one of the power amplifier sharing configuration or the phase noise sharing configuration (block 1120). For example, the base station (e.g., using transmit processor 220, receive processor 238, controller/processor 240, memory 242, and/or the like) may transmit, to the UE, a PTRS configuration for the plurality of layers based at least in part on at least one of the power amplifier sharing configuration or the phase noise sharing configuration, as described above.

As further shown in FIG. 11, in some aspects, process 1100 may include performing the single-carrier communication in accordance with the PTRS configuration (block 1130). For example, the base station (e.g., using transmit processor 220, receive processor 238, controller/processor 240, memory 242, and/or the like) may perform the single-carrier communication in accordance with the PTRS configuration, as described above.

Process 1100 may include additional aspects, such as any single aspect or any combination of aspects described below and/or in connection with one or more other processes described elsewhere herein.

In a first aspect, the PTRS configuration indicates that each layer, of the plurality of layers, is to include one or more PTRSs.

In a second aspect, the one or more PTRSs comprise a plurality of PTRSs that are inserted at different times within a symbol.

In a third aspect, a PTRS of a first layer, of the plurality of layers, is aligned in time with a PTRS of a second layer of the plurality of layers.

In a fourth aspect, the PTRS of the first layer and the PTRS of the second layer are encoded using an orthogonal cover code.

In a fifth aspect, the PTRS of the first layer and the PTRS of the second layer comprise respective PTRS chunks.

In a sixth aspect, the PTRS configuration indicates that a first layer, of the plurality of layers, includes a zero-power PTRS, and a second layer, of the plurality of layers, includes a non-zero-power PTRS corresponding to the zero-power PTRS.

In a seventh aspect, the PTRS configuration indicates a power boost for the non-zero-power PTRS.

In an eighth aspect, the PTRS configuration indicates that no power boost is to be used for the non-zero-power PTRS.

In a ninth aspect, the zero-power PTRS is associated with a larger chunk size than the non-zero-power PTRS.

In a tenth aspect, the zero-power PTRS includes the non-zero-power PTRS and at least a portion of one or more symbols adjacent to the non-zero-power PTRS.

In an eleventh aspect, the non-zero-power PTRS is associated with a head-tail pattern, and a location of the zero-power PTRS is based at least in part on a cyclic shift.

In a twelfth aspect, a location of the non-zero-power PTRS is derived based at least in part on a non-head-tail pattern with a different cyclic shift value than a pattern used to derive a location of the zero-power PTRS, wherein the different cyclic shift value is signaled to the UE by the base station.

In a thirteenth aspect, the first layer includes a non-zero-power PTRS, and the second layer includes a zero-power PTRS corresponding to the non-zero-power PTRS.

In a fourteenth aspect, the power amplifier sharing configuration indicates that a power amplifier of the UE is shared between the plurality of layers, the phase noise sharing configuration indicates that phase noise is shared between the plurality of layers, and the PTRS configuration indicates that a PTRS is transmitted in one layer of the plurality of layers.

In a fifteenth aspect, the power amplifier sharing configuration indicates that a power amplifier of the UE is not shared between the plurality of layers, and the phase noise sharing configuration indicates that phase noise is shared between the plurality of layers.

In a sixteenth aspect, each layer of the plurality of layers includes one or more non-zero-power PTRSs.

In a seventeenth aspect, a first layer of the plurality of layers includes one or more non-zero-power PTRSs and a second layer of the plurality of layers includes one or more zero-power PTRSs.

In an eighteenth aspect, the power amplifier sharing configuration indicates that a power amplifier of the UE is not shared between the plurality of layers, and the phase noise sharing configuration indicates that phase noise is not shared between the plurality of layers.

In a nineteenth aspect, a first layer of the plurality of layers includes one or more first non-zero-power PTRSs, a second layer of the plurality of layers includes one or more second non-zero-power PTRSs, and the one or more first non-zero-power PTRSs do not overlap the one or more second non-zero-power PTRSs.

In a twentieth aspect, each layer of the plurality of layers includes one or more non-zero-power PTRSs, and the one or more non-zero-power PTRSs are encoded using an orthogonal cover code.

In a twenty-first aspect, the power amplifier sharing configuration indicates that a power amplifier of the UE is shared between the plurality of layers, and the phase noise sharing configuration indicates that phase noise is not shared between the plurality of layers.

In a twenty-second aspect, a first layer of the plurality of layers includes one or more first non-zero-power PTRSs, a second layer of the plurality of layers includes one or more second non-zero-power PTRSs, and the one or more first non-zero-power PTRSs do not overlap the one or more second non-zero-power PTRSs.

In a twenty-third aspect, each layer of the plurality of layers includes one or more non-zero-power PTRSs, and the one or more non-zero-power PTRSs are encoded using an orthogonal cover code.

In a twenty-fourth aspect, process 1100 includes receiving, from the UE, information indicating a preferred PTRS waveform, and determining the PTRS configuration based at least in part on the information indicating the preferred PTRS waveform.

In a twenty-fifth aspect, the information indicating the preferred PTRS waveform indicates at least one of a number of layers included in the plurality of layers, a number of PTRSs per layer, or a number of PTRS chunks per layer.

In a twenty-sixth aspect, the PTRS configuration indicates a PTRS waveform for the single-carrier communication.

In a twenty-seventh aspect, a first layer of the plurality of layers is associated with a different PTRS configuration than a second layer of the plurality of layers.

In a twenty-eighth aspect, the single-carrier communication comprises an uplink communication.

In a twenty-ninth aspect, the single-carrier communication comprises a downlink communication.

In a thirtieth aspect, a PTRS of the single-carrier communication and data of the single-carrier communication are mixed in time, and discrete Fourier transform spreading is applied for the single-carrier communication before orthogonal frequency division multiplexing modulation of the single-carrier communication.

Although FIG. 11 shows example blocks of process 1100, in some aspects, process 1100 may include additional blocks, fewer blocks, different blocks, or differently arranged blocks than those depicted in FIG. 11. Additionally, or alternatively, two or more of the blocks of process 1100 may be performed in parallel.

The following provides an overview of some Aspects of the present disclosure:

Aspect 1: A method of wireless communication performed by a user equipment (UE), comprising: transmitting, to a base station, information indicating at least one of a power amplifier sharing configuration or a phase noise sharing configuration for a plurality of layers of a single-carrier communication; receiving, from the base station, a phase tracking reference signal (PTRS) configuration for the plurality of layers based at least in part on at least one of the power amplifier sharing configuration or the phase noise sharing configuration; and performing the single-carrier communication in accordance with the PTRS configuration.

Aspect 2: The method of Aspect 1, wherein the PTRS configuration indicates that each layer, of the plurality of layers, is to include one or more PTRSs.

Aspect 3: The method of Aspect 2, wherein the one or more PTRSs comprise a plurality of PTRSs that are inserted at different times within a symbol.

Aspect 4: The method of Aspect 2, wherein a PTRS of a first layer, of the plurality of layers, is aligned in time with a PTRS of a second layer of the plurality of layers.

Aspect 5: The method of Aspect 4, wherein the PTRS of the first layer and the PTRS of the second layer are encoded using an orthogonal cover code.

Aspect 6: The method of Aspect 5, wherein the PTRS of the first layer and the PTRS of the second layer comprise respective PTRS chunks.

Aspect 7: The method of any of Aspects 1-6, wherein the PTRS configuration indicates that a first layer, of the plurality of layers, includes a zero-power PTRS and a second layer, of the plurality of layers, includes a non-zero-power PTRS corresponding to the zero-power PTRS.

Aspect 8: The method of Aspect 7, wherein the PTRS configuration indicates a power boost for the non-zero-power PTRS.

Aspect 9: The method of Aspect 7, wherein the PTRS configuration indicates that no power boost is to be used for the non-zero-power PTRS.

Aspect 10: The method of Aspect 7, wherein the zero-power PTRS is associated with a larger chunk size than the non-zero-power PTRS.

Aspect 11: The method of Aspect 7, wherein the zero-power PTRS includes the non-zero-power PTRS and at least a portion of one or more symbols adjacent to the non-zero-power PTRS.

Aspect 12: The method of Aspect 11, wherein the non-zero-power PTRS is associated with a head-tail pattern, and wherein a location of the zero-power PTRS is based at least in part on a cyclic shift.

Aspect 13: The method of Aspect 7, wherein a location of the non-zero-power PTRS is derived based at least in part on a non-head-tail pattern with a different cyclic shift value than a pattern used to derive a location of the zero-power PTRS.

Aspect 14: The method of Aspect 7, wherein the first layer includes a non-zero-power PTRS and the second layer includes a zero-power PTRS corresponding to the non-zero-power PTRS.

Aspect 15: The method of any of Aspects 1-14, wherein the power amplifier sharing configuration indicates that a power amplifier of the UE is shared between the plurality of layers and the phase noise sharing configuration indicates that phase noise is shared between the plurality of layers, and wherein the PTRS configuration indicates that a PTRS is transmitted in one layer of the plurality of layers.

Aspect 16: The method of any of Aspects 1-15, wherein the power amplifier sharing configuration indicates that a power amplifier of the UE is not shared between the plurality of layers and the phase noise sharing configuration indicates that phase noise is shared between the plurality of layers.

Aspect 17: The method of Aspect 16, wherein each layer of the plurality of layers includes one or more non-zero-power PTRSs.

Aspect 18: The method of Aspect 16, wherein a first layer of the plurality of layers includes one or more non-zero-power PTRSs and a second layer of the plurality of layers includes one or more zero-power PTRSs.

Aspect 19: The method of any of Aspects 1-17, wherein the power amplifier sharing configuration indicates that a power amplifier of the UE is not shared between the plurality of layers and the phase noise sharing configuration indicates that phase noise is not shared between the plurality of layers.

Aspect 20: The method of Aspect 19, wherein a first layer of the plurality of layers includes one or more first non-zero-power PTRSs and a second layer of the plurality of layers includes one or more second non-zero-power PTRSs, and wherein the one or more first non-zero-power PTRSs do not overlap the one or more second non-zero-power PTRSs.

Aspect 21: The method of Aspect 19, wherein each layer of the plurality of layers includes one or more non-zero-power PTRSs, and wherein the one or more non-zero-power PTRSs are encoded using an orthogonal cover code.

Aspect 22: The method of any of Aspects 1-21, wherein the power amplifier sharing configuration indicates that a power amplifier of the UE is shared between the plurality of layers and the phase noise sharing configuration indicates that phase noise is not shared between the plurality of layers.

Aspect 23: The method of Aspect 22, wherein a first layer of the plurality of layers includes one or more first non-zero-power PTRSs and a second layer of the plurality of layers includes one or more second non-zero-power PTRSs, and wherein the one or more first non-zero-power PTRSs do not overlap the one or more second non-zero-power PTRSs.

Aspect 24: The method of Aspect 22, wherein each layer of the plurality of layers includes one or more non-zero-power PTRSs, and wherein the one or more non-zero-power PTRSs are encoded using an orthogonal cover code.

Aspect 25: The method of any of Aspects 1-24, further comprising: transmitting, to the base station, information indicating a preferred PTRS waveform.

Aspect 26: The method of Aspect 25, wherein the information indicating the preferred PTRS waveform indicates at least one of: a number of layers included in the plurality of layers, a number of PTRSs per layer, or a number of PTRS chunks per layer.

Aspect 27: The method of any of Aspects 1-26, wherein the PTRS configuration indicates a PTRS waveform for the single-carrier communication.

Aspect 28: The method of any of Aspects 1-27, wherein a first layer of the plurality of layers is associated with a different PTRS configuration than a second layer of the plurality of layers.

Aspect 29: The method of any of Aspects 1-28, wherein the single-carrier communication comprises an uplink communication.

Aspect 30: The method of any of Aspects 1-28, wherein the single-carrier communication comprises a downlink communication.

Aspect 31: The method of any of Aspects 1-30, wherein a PTRS of the single-carrier communication and data of the single-carrier communication are mixed in time, and wherein discrete Fourier transform spreading is applied for the single-carrier communication before orthogonal frequency division multiplexing modulation of the single-carrier communication.

Aspect 32: A method of wireless communication performed by a base station, comprising: receiving, from a user equipment (UE), information indicating at least one of a power amplifier sharing configuration or a phase noise sharing configuration for a plurality of layers of a single-carrier communication; transmitting, to the UE, a phase tracking reference signal (PTRS) configuration for the plurality of layers based at least in part on at least one of the power amplifier sharing configuration or the phase noise sharing configuration; and performing the single-carrier communication in accordance with the PTRS configuration.

Aspect 33: The method of Aspect 32, wherein the PTRS configuration indicates that each layer, of the plurality of layers, is to include one or more PTRSs.

Aspect 34: The method of Aspect 33, wherein the one or more PTRSs comprise a plurality of PTRSs that are inserted at different times within a symbol.

Aspect 35: The method of Aspect 34, wherein a PTRS of a first layer, of the plurality of layers, is aligned in time with a PTRS of a second layer of the plurality of layers.

Aspect 36: The method of Aspect 35, wherein the PTRS of the first layer and the PTRS of the second layer are encoded using an orthogonal cover code.

Aspect 37: The method of Aspect 36, wherein the PTRS of the first layer and the PTRS of the second layer comprise respective PTRS chunks.

Aspect 38: The method of any of Aspects 32-37, wherein the PTRS configuration indicates that a first layer, of the plurality of layers, includes a zero-power PTRS and a second layer, of the plurality of layers, includes a non-zero-power PTRS corresponding to the zero-power PTRS.

Aspect 39: The method of Aspect 38, wherein the PTRS configuration indicates a power boost for the non-zero-power PTRS.

Aspect 40: The method of Aspect 38, wherein the PTRS configuration indicates that no power boost is to be used for the non-zero-power PTRS.

Aspect 41: The method of Aspect 38, wherein the zero-power PTRS is associated with a larger chunk size than the non-zero-power PTRS.

Aspect 42: The method of Aspect 38, wherein the zero-power PTRS includes the non-zero-power PTRS and at least a portion of one or more symbols adjacent to the non-zero-power PTRS.

Aspect 43: The method of Aspect 42, wherein the non-zero-power PTRS is associated with a head-tail pattern, and wherein a location of the zero-power PTRS is based at least in part on a cyclic shift.

Aspect 44: The method of Aspect 38, wherein a location of the non-zero-power PTRS is derived based at least in part on a non-head-tail pattern with a different cyclic shift value than a pattern used to derive a location of the zero-power PTRS, wherein the different cyclic shift value is signaled to the UE by the base station.

Aspect 45: The method of Aspect 38, wherein the first layer includes a non-zero-power PTRS and the second layer includes a zero-power PTRS corresponding to the non-zero-power PTRS.

Aspect 46: The method of any of Aspects 32-45, wherein the power amplifier sharing configuration indicates that a power amplifier of the UE is shared between the plurality of layers and the phase noise sharing configuration indicates that phase noise is shared between the plurality of layers, and wherein the PTRS configuration indicates that a PTRS is transmitted in one layer of the plurality of layers.

Aspect 47: The method of any of Aspects 32-46, wherein the power amplifier sharing configuration indicates that a power amplifier of the UE is not shared between the plurality of layers and the phase noise sharing configuration indicates that phase noise is shared between the plurality of layers.

Aspect 48: The method of Aspect 47, wherein each layer of the plurality of layers includes one or more non-zero-power PTRSs.

Aspect 49: The method of Aspect 47, wherein a first layer of the plurality of layers includes one or more non-zero-power PTRSs and a second layer of the plurality of layers includes one or more zero-power PTRSs.

Aspect 50: The method of any of Aspects 32-49, wherein the power amplifier sharing configuration indicates that a power amplifier of the UE is not shared between the plurality of layers and the phase noise sharing configuration indicates that phase noise is not shared between the plurality of layers.

Aspect 51: The method of Aspect 50, wherein a first layer of the plurality of layers includes one or more first non-zero-power PTRSs and a second layer of the plurality of layers includes one or more second non-zero-power PTRSs, and wherein the one or more first non-zero-power PTRSs do not overlap the one or more second non-zero-power PTRSs.

Aspect 52: The method of Aspect 51, wherein each layer of the plurality of layers includes one or more non-zero-power PTRSs, and wherein the one or more non-zero-power PTRSs are encoded using an orthogonal cover code.

Aspect 53: The method of any of Aspects 32-52, wherein the power amplifier sharing configuration indicates that a power amplifier of the UE is shared between the plurality of layers and the phase noise sharing configuration indicates that phase noise is not shared between the plurality of layers.

Aspect 54: The method of Aspect 53, wherein a first layer of the plurality of layers includes one or more first non-zero-power PTRSs and a second layer of the plurality of layers includes one or more second non-zero-power PTRSs, and wherein the one or more first non-zero-power PTRSs do not overlap the one or more second non-zero-power PTRSs.

Aspect 55: The method of Aspect 53, wherein each layer of the plurality of layers includes one or more non-zero-power PTRSs, and wherein the one or more non-zero-power PTRSs are encoded using an orthogonal cover code.

Aspect 56: The method of any of Aspect 32-55, further comprising: receiving, from the UE, information indicating a preferred PTRS waveform; and determining the PTRS configuration based at least in part on the information indicating the preferred PTRS waveform.

Aspect 57: The method of Aspect 56, wherein the information indicating the preferred PTRS waveform indicates at least one of: a number of layers included in the plurality of layers, a number of PTRSs per layer, or a number of PTRS chunks per layer.

Aspect 58: The method of any of Aspects 32-57, wherein the PTRS configuration indicates a PTRS waveform for the single-carrier communication.

Aspect 59: The method of any of Aspects 32-58, wherein a first layer of the plurality of layers is associated with a different PTRS configuration than a second layer of the plurality of layers.

Aspect 60: The method of any of Aspects 32-59, wherein the single-carrier communication comprises an uplink communication.

Aspect 61: The method of any of Aspects 32-60, wherein the single-carrier communication comprises a downlink communication.

Aspect 62: The method of any of Aspects 32-61, wherein a PTRS of the single-carrier communication and data of the single-carrier communication are mixed in time, and wherein discrete Fourier transform spreading is applied for the single-carrier communication before orthogonal frequency division multiplexing modulation of the single-carrier communication.

Aspect 63: An apparatus for wireless communication at a device, comprising a processor; memory coupled with the processor; and instructions stored in the memory and executable by the processor to cause the apparatus to perform the method of one or more of Aspects 1-62.

Aspect 64: A device for wireless communication, comprising a memory and one or more processors coupled to the memory, the one or more processors configured to perform the method of one or more of Aspects 1-62.

Aspect 65: An apparatus for wireless communication, comprising at least one means for performing the method of one or more of Aspects 1-62.

Aspect 66: A non-transitory computer-readable medium storing code for wireless communication, the code comprising instructions executable by a processor to perform the method of one or more of Aspects 1-62.

Aspect 67: A non-transitory computer-readable medium storing a set of instructions for wireless communication, the set of instructions comprising one or more instructions that, when executed by one or more processors of a device, cause the device to perform the method of one or more of Aspects 1-62.

The foregoing disclosure provides illustration and description, but is not intended to be exhaustive or to limit the aspects to the precise forms disclosed. Modifications and variations may be made in light of the above disclosure or may be acquired from practice of the aspects.

As used herein, the term "component" is intended to be broadly construed as hardware and/or a combination of hardware and software. "Software" shall be construed broadly to mean instructions, instruction sets, code, code segments, program code, programs, subprograms, software modules, applications, software applications, software packages, routines, subroutines, objects, executables, threads of execution, procedures, and/or functions, among other examples, whether referred to as software, firmware, middleware, microcode, hardware description language, or otherwise. As used herein, a processor is implemented in hardware and/or a combination of hardware and software. It will be apparent that systems and/or methods described herein may be implemented in different forms of hardware and/or a combination of hardware and software. The actual specialized control hardware or software code used to implement these systems and/or methods is not limiting of the aspects. Thus, the operation and behavior of the systems and/or methods were described herein without reference to specific software code—it being understood that software and hardware can be designed to implement the systems and/or methods based, at least in part, on the description herein.

As used herein, satisfying a threshold may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of various aspects. In fact, many of these features may be combined in ways not specifically recited in the claims and/or disclosed in the specification. Although each dependent claim listed below may directly depend on only one claim, the disclosure of various aspects includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Furthermore, as used herein, the terms "set" and "group" are intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. An apparatus for wireless communication at a user equipment (UE), comprising:
    one or more memories; and
    one or more processors, coupled to the one or more memories, configured to:
        transmit, to a base station, information indicating at least a phase noise sharing configuration for a plurality of layers of a single-carrier communication,
        wherein the phase noise sharing configuration indicates whether multiple layers of the plurality of layers share phase noise;
        receive, from the base station, a phase tracking reference signal (PTRS) configuration for the plurality of layers based at least in part on the phase noise sharing configuration,
        wherein the PTRS configuration is associated with each layer, of the plurality of layers, including a plurality of PTRSs at different times within a symbol, and
        wherein a PTRS of a first layer, of the plurality of layers, is aligned in time with a PTRS of a second layer of the plurality of layers; and
    perform the single-carrier communication in accordance with the PTRS configuration.

2. The apparatus of claim 1, wherein the PTRS of the first layer and the PTRS of the second layer use an orthogonal cover code.

3. The apparatus of claim 1, wherein the PTRS configuration indicates that the first layer includes a zero-power PTRS and the second layer includes a non-zero-power PTRS corresponding to the zero-power PTRS.

4. The apparatus of claim 3, wherein the zero-power PTRS is associated with a larger chunk size than the non-zero-power PTRS.

5. The apparatus of claim 3, wherein a location of the non-zero-power PTRS is based at least in part on a non-head-tail pattern with a different cyclic shift value than a pattern used to derive a location of the zero-power PTRS.

6. The apparatus of claim 3, wherein the first layer includes a non-zero-power PTRS and the second layer includes a zero-power PTRS corresponding to the non-zero-power PTRS.

7. The apparatus of claim 1, wherein the information further indicates a power amplifier sharing configuration, wherein the power amplifier sharing configuration indicates that a power amplifier of the UE is shared between the plurality of layers and the phase noise sharing configuration indicates that phase noise is shared between the plurality of layers.

8. The apparatus of claim 1, wherein the one or more processors are further configured to:
    transmit, to the base station, information indicating a preferred PTRS waveform.

9. The apparatus of claim 8, wherein the information indicating the preferred PTRS waveform indicates at least one of:
a number of layers included in the plurality of layers,
a number of PTRSs per layer, or
a number of PTRS chunks per layer.

10. The apparatus of claim 8, wherein the information indicating the preferred PTRS waveform is the information indicating at least the phase noise sharing configuration.

11. The apparatus of claim 1, wherein the PTRS configuration indicates a PTRS waveform for the single-carrier communication.

12. The apparatus of claim 1, wherein the first layer is associated with a different PTRS configuration than the second layer.

13. The apparatus of claim 1, wherein a PTRS of the single-carrier communication and data of the single-carrier communication are mixed in time.

14. An apparatus for wireless communication at a base station, comprising:
one or more memories; and
one or more processors, coupled to the one or more memories, configured to:
receive, from a user equipment (UE), information indicating at least a phase noise sharing configuration for a plurality of layers of a single-carrier communication,
wherein the phase noise sharing configuration indicates whether multiple layers of the plurality of layers share phase noise;
transmit, to the UE, a phase tracking reference signal (PTRS) configuration for the plurality of layers based at least in part on the phase noise sharing configuration,
wherein the PTRS configuration is associated with each layer, of the plurality of layers, including a plurality of PTRSs at different times within a symbol, and
wherein a PTRS of a first layer, of the plurality of layers, is aligned in time with a PTRS of a second layer of the plurality of layers; and
perform the single-carrier communication in accordance with the PTRS configuration.

15. The apparatus of claim 14, wherein the PTRS of the first layer and the PTRS of the second layer use an orthogonal cover code.

16. The apparatus of claim 15, wherein the PTRS of the first layer and the PTRS of the second layer comprise respective PTRS chunks.

17. The apparatus of claim 14, wherein the PTRS configuration indicates that the first layer includes a zero-power PTRS and the second layer includes a non-zero-power PTRS corresponding to the zero-power PTRS.

18. The apparatus of claim 17, wherein a location of the non-zero-power PTRS is based at least in part on a non-head-tail pattern with a different cyclic shift value than a pattern used to derive a location of the zero-power PTRS, wherein the different cyclic shift value is signaled to the UE by the base station.

19. The apparatus of claim 14, wherein the one or more processors are further configured to:
receive, from the UE, information indicating a preferred PTRS waveform; and
determine the PTRS configuration based at least in part on the information indicating the preferred PTRS waveform.

20. The apparatus of claim 14, wherein the PTRS configuration indicates a PTRS waveform for the single-carrier communication.

21. The apparatus of claim 14, wherein a PTRS of the single-carrier communication and data of the single-carrier communication are mixed in time, and wherein the one or more processors, when performing the single-carrier communication, are configured to apply discrete Fourier transform spreading for the single-carrier communication before orthogonal frequency division multiplexing modulation of the single-carrier communication.

22. A method of wireless communication performed by an apparatus of a user equipment (UE), comprising:
transmitting, to a base station, information indicating at least a phase noise sharing configuration for a plurality of layers of a single-carrier communication,
wherein the phase noise sharing configuration indicates whether multiple layers of the plurality of layers share phase noise;
receiving, from the base station, a phase tracking reference signal (PTRS) configuration for the plurality of layers based at least in part on the phase noise sharing configuration,
wherein the PTRS configuration is associated with each layer, of the plurality of layers, including a plurality of PTRSs at different times within a symbol, and
wherein a PTRS of a first layer, of the plurality of layers, is aligned in time with a PTRS of a second layer of the plurality of layers; and
performing the single-carrier communication in accordance with the PTRS configuration.

23. The method of claim 22, further comprising:
transmitting, to the base station, information indicating a preferred PTRS waveform.

24. A method of wireless communication performed by a base station, comprising:
receiving, from a user equipment (UE), information indicating at least a phase noise sharing configuration for a plurality of layers of a single-carrier communication,
wherein the phase noise sharing configuration indicates whether multiple layers of the plurality of layers share phase noise;
transmitting, to the UE, a phase tracking reference signal (PTRS) configuration for the plurality of layers based at least in part on the phase noise sharing configuration,
wherein the PTRS configuration is associated with each layer, of the plurality of layers, including a plurality of PTRSs at different times within a symbol, and
wherein a PTRS of a first layer, of the plurality of layers, is aligned in time with a PTRS of a second layer of the plurality of layers; and
performing the single-carrier communication in accordance with the PTRS configuration.

25. The apparatus of claim 2, wherein the PTRS of the first layer and the PTRS of the second layer comprise respective PTRS chunks.

26. The apparatus of claim 14, wherein the information further indicates a power amplifier sharing configuration, wherein the power amplifier sharing configuration indicates that a power amplifier of the UE is shared between the plurality of layers and the phase noise sharing configuration indicates that phase noise is shared between the plurality of layers.

27. The apparatus of claim 14, wherein the first layer is associated with a different PTRS configuration than the second layer.

28. The apparatus of claim 17, wherein the zero-power PTRS is associated with a larger chunk size than the non-zero-power PTRS.

29. The apparatus of claim 17, wherein the first layer includes a non-zero-power PTRS and the second layer includes a zero-power PTRS corresponding to the non-zero-power PTRS.

30. The apparatus of claim 19, wherein the information indicating the preferred PTRS waveform indicates at least one of:
   a number of layers included in the plurality of layers,
   a number of PTRSs per layer, or
   a number of PTRS chunks per layer.

* * * * *